United States Patent
Sugihara

(10) Patent No.: US 10,629,642 B2
(45) Date of Patent: Apr. 21, 2020

(54) STACKED IMAGE SENSOR AND SYSTEM INCLUDING THE SAME

(71) Applicant: SAMSUNG ELECTRONICS CO., LTD., Suwon-si, Gyeonggi-Do (KR)

(72) Inventor: Hiroyuki Sugihara, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/232,228

(22) Filed: Dec. 26, 2018

(65) Prior Publication Data

US 2019/0131337 A1    May 2, 2019

Related U.S. Application Data

(63) Continuation of application No. 15/165,725, filed on May 26, 2016, now Pat. No. 10,199,416.

(30) Foreign Application Priority Data

Jul. 31, 2015    (KR) .................. 10-2015-0108429

(51) Int. Cl.
  *H01L 27/146*    (2006.01)

(52) U.S. Cl.
  CPC .. *H01L 27/14634* (2013.01); *H01L 27/14612* (2013.01); *H01L 27/14636* (2013.01); *H01L 27/14645* (2013.01); *H01L 27/14621* (2013.01); *H01L 27/14627* (2013.01)

(58) Field of Classification Search
  CPC ......... H01L 27/14634; H01L 27/14645; H01L 27/14612; H01L 27/14636; H01L 27/14621; H01L 27/14627; H01L 27/14609; H04N 5/369
  See application file for complete search history.

(56) References Cited

U.S. PATENT DOCUMENTS

| | | | |
|---|---|---|---|
| 7,041,527 B2 | 5/2006 | Wu | |
| 7,164,113 B2 | 1/2007 | Inokuma et al. | |
| 8,742,524 B2 | 6/2014 | Itonaga et al. | |
| 8,773,562 B1 | 7/2014 | Fan | |
| 9,000,501 B2 | 4/2015 | Kudoh | |
| 2012/0293698 A1 | 11/2012 | Sukegawa et al. | |
| 2013/0126707 A1 | 5/2013 | Blanquart | |
| 2014/0077057 A1 | 3/2014 | Chao et al. | |

(Continued)

*Primary Examiner* — Tony Ko
(74) *Attorney, Agent, or Firm* — Volentine, Whitt & Francos, PLLC

(57) ABSTRACT

A stacked image sensor includes a first semiconductor die and a second semiconductor die. The first semiconductor die includes a pixel array of rows and columns of pixels, a first column interlayer-connection unit extending in the row direction and disposed adjacent the top or bottom of the pixel array and column routing wires extending in a diagonal direction and connecting the pixel columns and the first column interlayer-connection unit. The second semiconductor die is stacked with the first semiconductor die. The second semiconductor die includes a second column interlayer-connection unit extending in the row direction and disposed at a location corresponding to the first column interlayer-connection unit and connected to the first column interlayer-connection unit, and a column control circuit connected to the second column interlayer-connection unit.

6 Claims, 17 Drawing Sheets

(56) References Cited

U.S. PATENT DOCUMENTS

| | | | |
|---|---|---|---|
| 2014/0077063 A1* | 3/2014 | Cho | H01L 27/14634 |
| | | | 250/208.1 |
| 2014/0217542 A1 | 8/2014 | Itonaga et al. | |
| 2014/0231950 A1 | 8/2014 | Mitsuhashi | |
| 2014/0240565 A1 | 8/2014 | Murakami | |
| 2015/0115134 A1 | 4/2015 | Solhusvik et al. | |
| 2015/0118781 A1 | 4/2015 | Chen et al. | |
| 2015/0229860 A1* | 8/2015 | Wany | H04N 5/3696 |
| | | | 250/208.1 |

\* cited by examiner

STACKED IMAGE SENSOR AND SYSTEM INCLUDING THE SAME

PRIORITY STATEMENT

This is a Continuation of U.S. application Ser. No. 15/165,725, filed May 26, 2016, which claims priority under 35 USC § 119 to Korean Patent Application No. 10-2015-0108429, filed on Jul. 31, 2015, in the Korean Intellectual Property Office (KIPO), the disclosure of which is incorporated by reference in its entirety herein.

BACKGROUND

1. Technical Field

The inventive concept relates generally to image sensors comprising a package of stacked semiconductor integrated circuits (dies) and to electronic systems including such image sensors.

2. Discussion of the Related Art

Recently, the demand for more highly functional and compact mobile devices such as smart phones, tablet computers, etc. requires the miniaturization of components, e.g., packaged components, and features of the devices by means of high integration and high packaging techniques. One of these components sought to be miniaturized is an image sensor package. To lower the manufacturing costs of such packages, in addition to providing for their miniaturization, one semiconductor die may be provided with a pixel array while the other circuits may be provided in another semiconductor die and then the two semiconductor dies are stacked. However, due to process margins associated with their design, current image sensors including stacked dies do not allow for a desired level of miniaturization to be realized in electronic devices and especially mobile devices such as smart phones, tablet computers, etc.

SUMMARY

An image sensor according to the inventive concept comprises a first semiconductor die including a pixel array of rows and columns of pixels, first column interlayer-connection structure whose footprint is elongated in a row direction and lies adjacent to one of first and second opposite sides of the pixel array, and column routing wires extending linearly in a diagonal direction and connecting the columns of pixels independently of one another to the first column interlayer-connection structure, and a second semiconductor die stacked with and joined to the first semiconductor die, the second semiconductor die including second column interlayer-connection structure and column control circuitry. The second column interlayer-connection structure is electrically connected to the first column interlayer-connection unit, the footprint of the second column interlayer-connection structure is elongated in the row direction and occupies a position vertically corresponding to that of the first column interlayer-connection structure in the stack of the first and second semiconductor dies, and the column control circuitry is electrically connected to the second column interlayer-connection structure. Here, the row direction refers to the direction parallel to the rows of pixels, and the diagonal direction refers to a direction that subtends an acute angle with the row direction.

An image sensor according to the inventive concept comprises a first semiconductor die including a pixel array of rows and columns of pixels, first column interlayer-connection structure disposed adjacent to one of first and second opposite sides of the pixel array and having a footprint that is elongated in a row direction, first row interlayer-connection structure disposed adjacent to one of third and fourth opposite sides of the pixel array and having a footprint that is elongated in a column direction, column routing wires electrically connecting the columns of pixels independently of one another to the first column interlayer-connection structure, and row routing wires electrically connecting the rows of pixels independently of one another to the first row interlayer-connection structure; and a second semiconductor die stacked with and joined to the first semiconductor die and including second column interlayer-connection structure electrically connected to the first column interlayer-connection structure, second row interlayer-connection structure electrically connected to the first row interlayer-connection structure, column control circuitry electrically connected to the second column interlayer-connection structure, and row control circuitry electrically connected to the second row interlayer-connection unit. The footprint of the second column interlayer-connection structure is elongated in the row direction and lies at a position aligned, in the direction in which the dies are stacked, with that of the first column interlayer-connection unit. The footprint of the second row interlayer-connection structure is elongated in the column direction and lies at a position, aligned, in the direction in which the dies are stacked, with that of the first row interlayer-connection structure. Also, the column routing wires and/or the row routing wires are linear wires extending lengthwise in a diagonal direction that subtends acute angles with the row direction and the column direction, respectively.

A system, according to the inventive concept, comprises a processor and a stacked image sensor controlled by the processor. The stacked image sensor includes a first semiconductor die and a second semiconductor die. The first semiconductor die includes a pixel array in which pixels are arranged in pixel rows and pixel columns, a first column interlayer-connection unit extended in a row direction and disposed adjacent to a top side or a bottom side of the pixel array and column routing wires extended in a diagonal direction to connect the pixel columns and the first column interlayer-connection unit. The second semiconductor die is stacked with the first semiconductor die. The second semiconductor die includes a second column interlayer-connection unit extended in the row direction and disposed at a position corresponding to the first column interlayer-connection unit to be connected to the first column interlayer-connection unit and a column control circuit connected to the second column interlayer-connection unit.

Still further, an image sensor according to the inventive concept comprises first and second dies stacked one on the other and joined to each other, the first die including a semiconductor substrate, a pixel array, and routing wires, and the second die including a semiconductor substrate, and pixel array control circuitry. The pixel array comprises rows and columns of pixels, column data lines each of which electrically connects the pixels in a respective column of the pixels, and row selection lines each of which electrically connects the pixels in a respective row of the pixels, the pixels in each of the rows being arrayed in a first direction, and the pixels in each of the columns being arrayed in a second direction. The routing wires comprise column routing wires electrically connected to the column data lines at ends of the column data lines, respectively, and by which all of the pixels of the pixel array are electrically connected to the pixel array control circuitry of the second die, and row routing wires electrically connected to the row selection lines at ends of the row selection lines, respectively and by which all of the pixels of the pixel array are electrically connected to the pixel array control circuitry of the second die. Also, all of the row routing wires and/or all of the column routing wires are linear, and extend lengthwise within the same layer in the first die parallel to one another in a diagonal direction that subtends acute angles with the first and second directions, respectively.

BRIEF DESCRIPTION OF THE DRAWINGS

Examples of the inventive concept will be more clearly understood from the following detailed description taken in conjunction with the accompanying drawings.

DETAILED DESCRIPTION OF THE EMBODIMENTS

Figure 1:
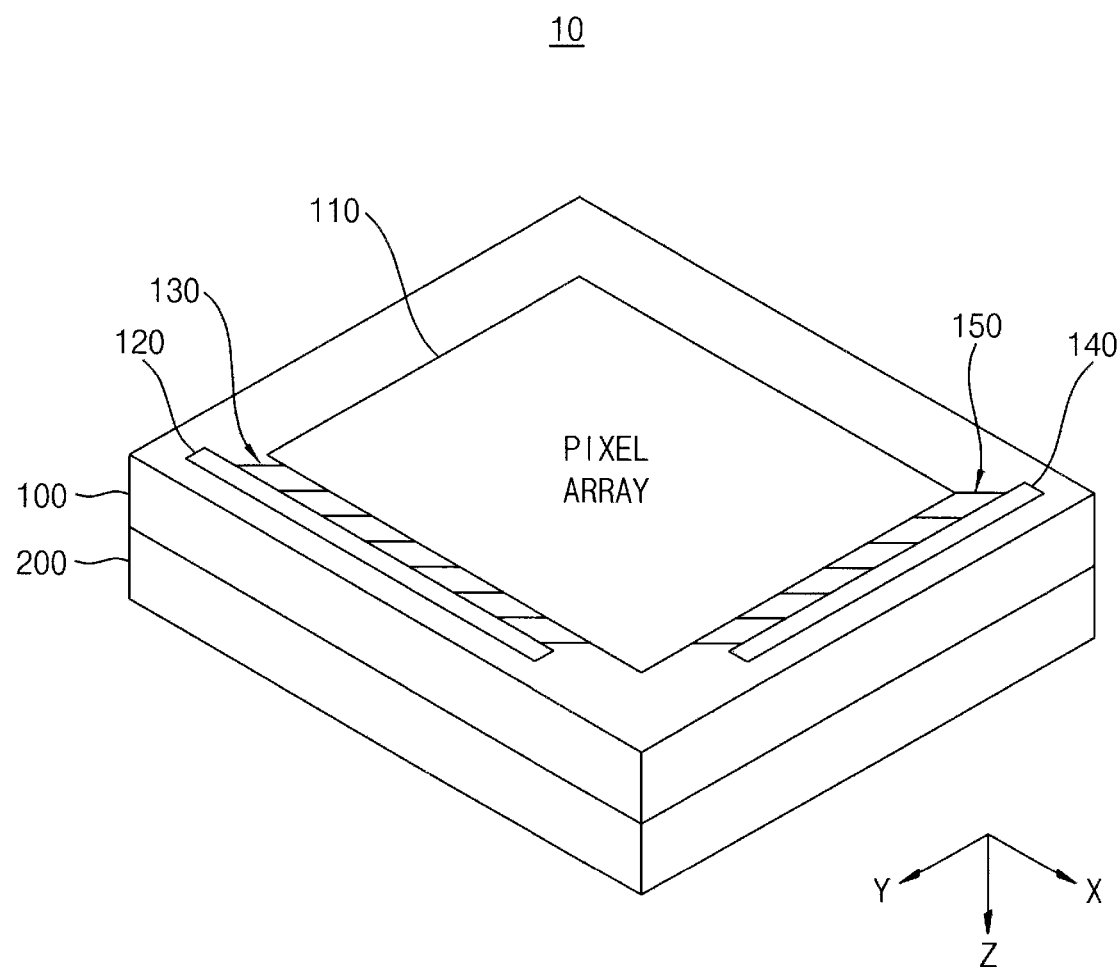
FIG. 1 is a perspective view of a stacked image sensor according to examples.

The inventive concept will be described more fully hereinafter with reference to the accompanying drawings, in which some examples according to the inventive concept are shown. The inventive concept may, however, be embodied in many different forms and should not be construed as limited to the examples set forth herein. Rather, these examples are provided so that this disclosure will be thorough and complete, and will fully convey the scope of the inventive concept to those skilled in the art. In the drawings, the sizes and relative sizes of layers and regions may be exaggerated for clarity. Like numerals designate like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. For example, the term "footprint" will be understood as generally referring to the outline of structure as viewed in plan as representative of the area occupied by the structure. Also, the term die will be understood as a unit including a substrate, such as semiconductor substrate, and integrated circuitry, and which may have one or more insulating or inter-layer insulating layers (e.g., dielectric layers) on the substrate. Therefore, when features are described as being part of "the same layer" such a description will be understood as referring to the fact the features are confined within or to a surface of a substrate or layer that has been formed on the substrate. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
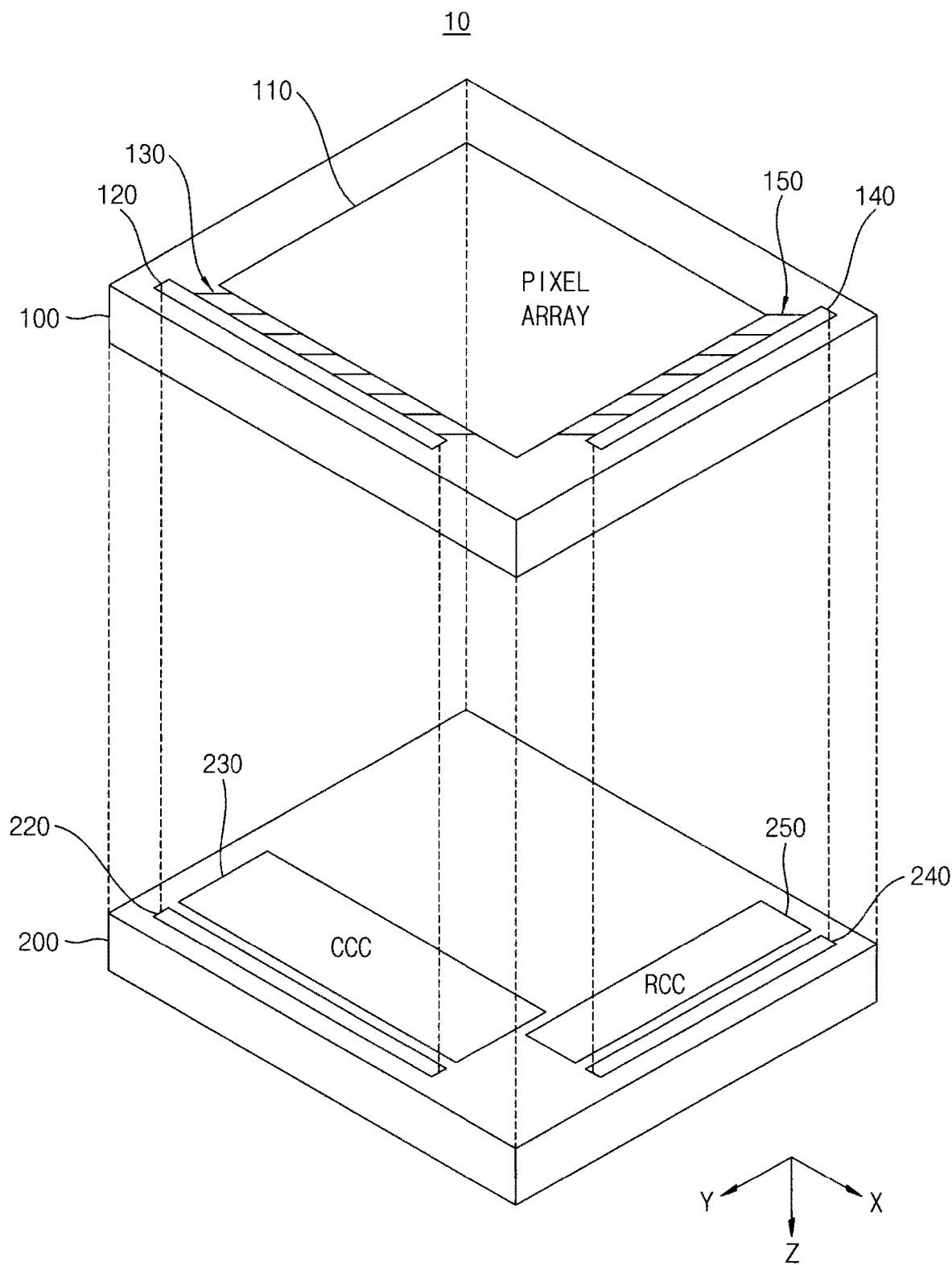
FIG. 2 is a diagram illustrating a disassembled state of the stacked image sensor of FIG. 1.

FIG. 1 is a perspective view of a stacked image sensor according to examples, and FIG. 2 is a diagram illustrating a disassembled state of the stacked image sensor of FIG. 1. Also, FIGS. 1 and 2 are schematic in nature in that they illustrate the footprints of various connection structure and circuitry described in more detail below.

Referring to FIGS. 1 and 2, a stacked image sensor 10 includes a first semiconductor die 100 and a second semiconductor die 200 that are stacked in a vertical direction Z. For example, the first semiconductor die 100 may be stacked on the second semiconductor die 200 as illustrated in FIGS. 1 and 2.

The first semiconductor die 100 may include a pixel array 110, a first column interlayer-connection unit 120, column routing wires 130, a first row interlayer-connection unit 140 and row routing wires 150.

Figure 5:
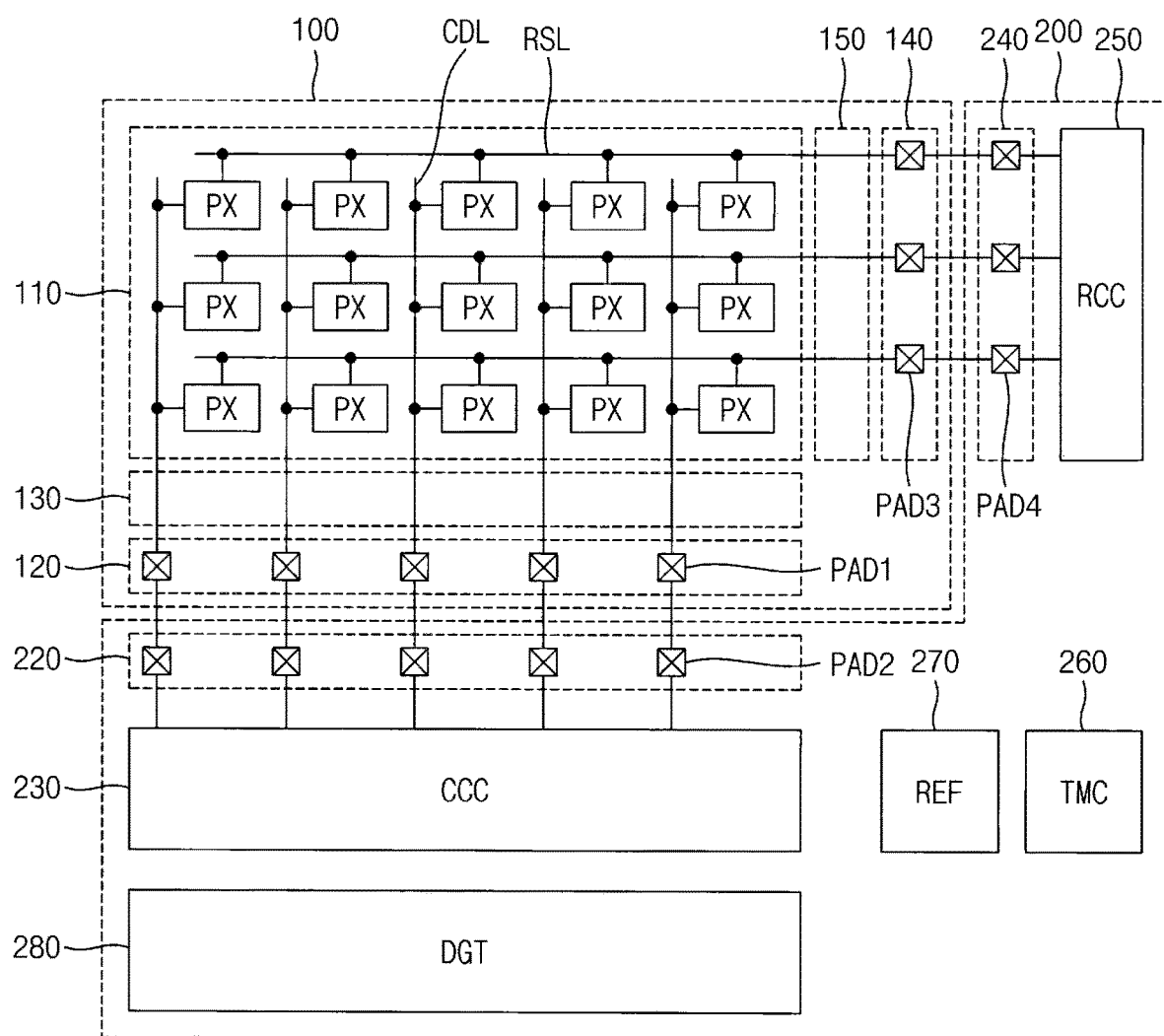
FIG. 5 is a block diagram illustrating a stacked image sensor according to examples.

Pixels PX are arranged in pixel rows and pixel columns in the pixel array 110 as illustrated in FIG. 5. The first column interlayer-connection unit 120 extends lengthwise in a row direction X and is disposed adjacent to a top side or a bottom side of the pixel array 110. The first row interlayer-connection unit 140 extends lengthwise in a column direction Y and is disposed adjacent to a left side or a right side of the pixel array 110. For example, as illustrated in FIGS. 1 and 2, the first column interlayer-connection unit 120 may be disposed adjacent to the bottom side of the pixel array 110 and the first row interlayer-connection unit 140 may be disposed adjacent to the right side of the pixel array 110. The column routing wires 130 connect the pixel columns and the first column interlayer-connection unit 120. The row routing wires 150 connect the pixel rows and the first row interlayer-connection unit 140.

The second semiconductor die 200 may include a second column interlayer-connection unit 220, a column control circuit CCC 230, a second row interlayer-connection unit 240 and a row control circuit RCC 250.

The second column interlayer-connection unit 220 extends lengthwise in the row direction X and is disposed at a position corresponding to the first column interlayer-connection unit 120 so that the second column interlayer-connection unit 220 may be connected to the first column interlayer-connection unit 120 when the first semiconductor die 100 and the second semiconductor die 200 are stacked. The second row interlayer-connection unit 240 extends lengthwise in the column direction Y and is disposed at a position corresponding to the first row interlayer-connection unit 140 so that the second row interlayer-connection unit 240 may be connected to the first row interlayer-connection unit 140 when the first semiconductor die 100 and the second semiconductor die 200 are stacked. The column control circuit 230 is connected to the second column interlayer-connection unit 220 and the row control circuit 250 is connected to the second row interlayer-connection unit 240. Accordingly, the column control circuit 230 of the second semiconductor die 200 may be connected to the pixel columns in the pixel array 110 of the first semiconductor die 100 through the column routing wires 130, the first column interlayer-connection unit 120 and the second column interlayer-connection unit 220. The row control circuit 250 disposed in the second semiconductor die 200 may be connected to the pixel rows in the pixel array 110 disposed in the first semiconductor die 100 through the row routing wires 150, the first row interlayer-connection unit 140 and the second row interlayer-connection unit 240.

As described below, each of the interlayer-connection units 120, 140, 220 and 240 may include bonding pads formed on a surface of the semiconductor die, vertical contacts of the dielectric layer of the semiconductor die and/or through-substrate vias penetrating the semiconductor substrate of the semiconductor die. The column control circuit 230 may include comparators, counters and correlated double sampling circuits to convert the analog signals from the pixel columns in the pixel array 110 to digital signals. The row control circuit 250 may include drivers to apply predetermined voltages to the pixel rows in the pixel array 110. Even though not illustrated in FIG. 2, the second semiconductor die 200 may also include a timing controller, a reference signal generator, a digital circuit etc.

According to examples, the column routing wires 130 and/or the row routing wires 150 may have a slide routing structure in which the wires extend linearly in a diagonal direction. The diagonal direction may be an arbitrary direction that is parallel with the top and bottom surfaces of the semiconductor die and is not parallel with the row direction X and the column direction Y. Using such slide routing structure, the stacked image sensor 10 may possess a relatively great margin in connection with the design of its circuitry and a relatively small size, i.e., may have a high degree of miniaturization. In addition, loads along the conductive paths between the pixel array 110 and the column control circuit 230 and/or between the pixel array 110 and the row control circuit 250 may be highly uniform in the stacked image sensor 10 to enhance the performance of the stacked image sensor 10 and the system including the stacked image sensor 10.

Figure 3:
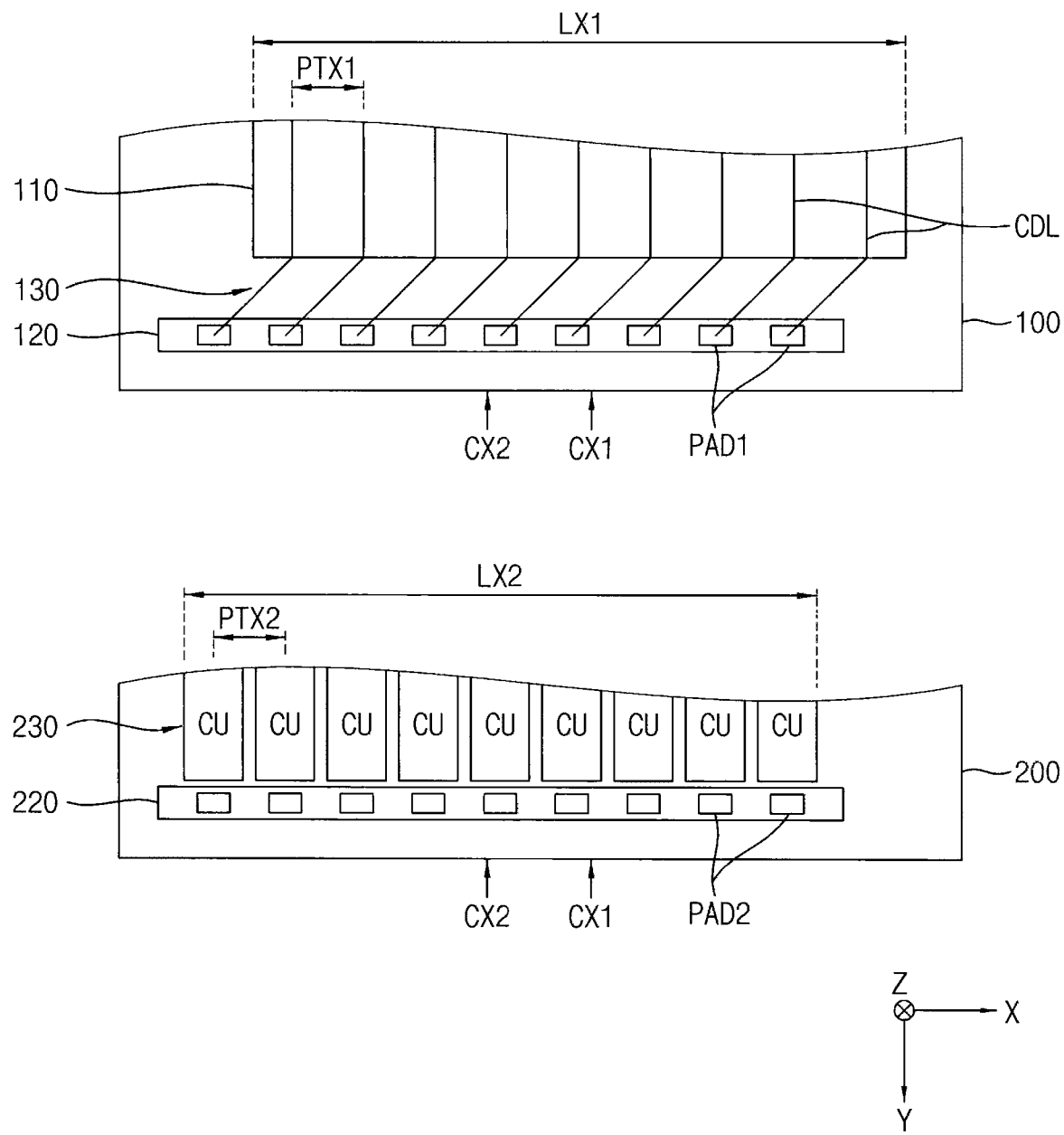
FIGS. 3 and 4 are diagrams illustrating a slide routing structure adopted in the stacked image sensor of FIG. 1.
Figure 4:
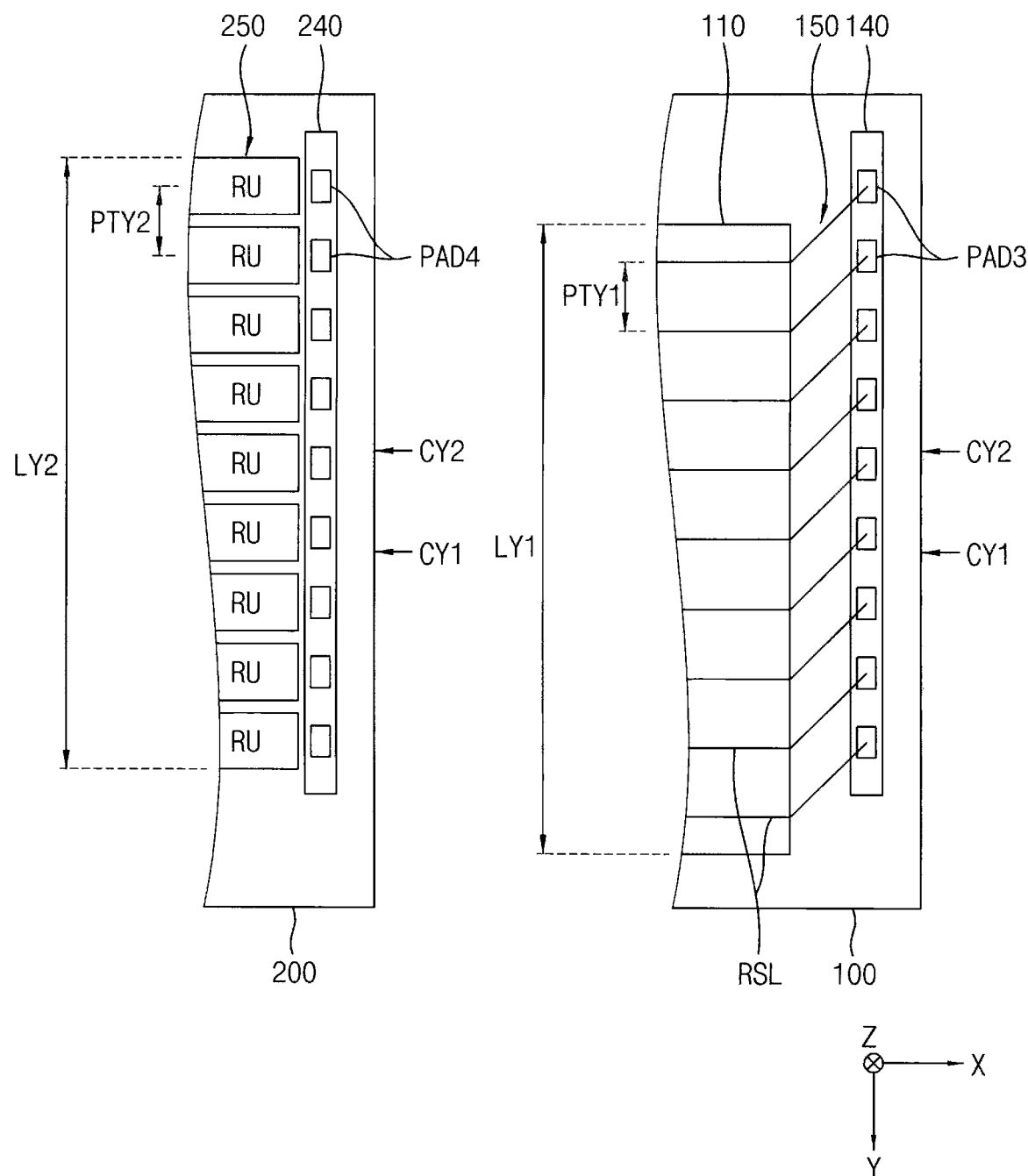

FIGS. 3 and 4 are diagrams illustrating a slide routing structure adopted in the stacked image sensor of FIG. 1.

FIG. 3 illustrates an example in which a slide routing structure is implemented in the first column interlayer-connection unit 120 and the column routing wires 130 and FIG. 4 illustrates an example in which a slide routing structure is implemented in the first row interlayer-connection unit 140 and the row routing wires 150.

Figure 8:
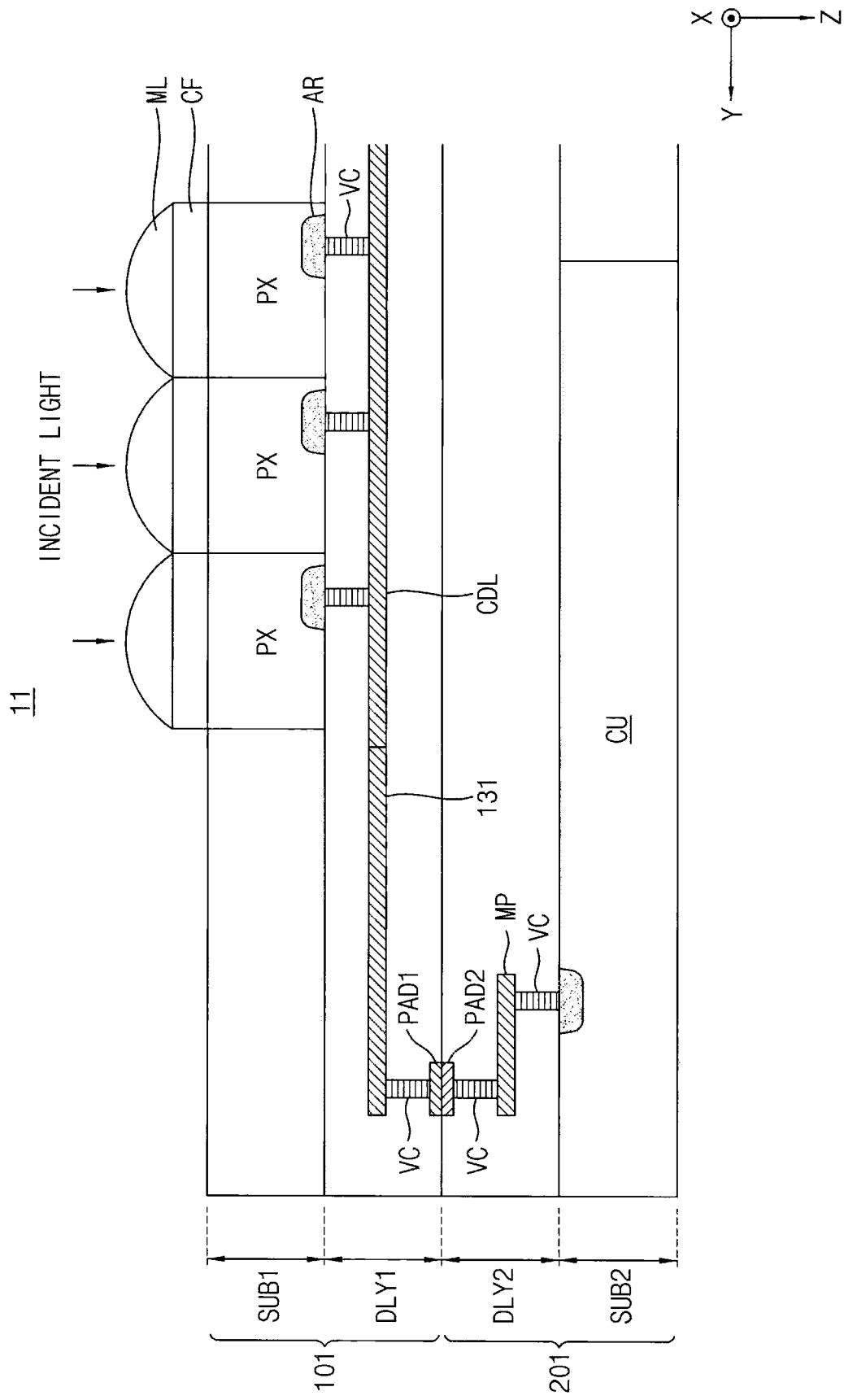
FIG. 8 is a cross-sectional view of a stacked image sensor according to an example.

Referring to FIG. 3, the pixel columns of the pixel array 110 of the first semiconductor die 100 may be respectively connected to the column data lines CDL as illustrated in FIG. 5. A pitch PTX1 between the pixel columns may be defined as an interval between the two adjacent column data lines CDL. The first column interlayer-connection unit 120 may include first column bonding pads PAD1 arranged in the row direction X. The first column bonding pads PAD1 may be disposed on a surface of the first semiconductor die 100 that is bonded to a surface of the second semiconductor die 200 as illustrated in FIG. 8. The column routing wires 130 may be of the dielectric layer of the first semiconductor die 100 and thus the column routing wires 130 may be connected to the first column bonding pads PAD1 on the surface of the first semiconductor die 100 through vertical contacts.

According to examples, the column routing wires 130 extend linearly in the diagonal direction to connect the column data lines CDL and the first column bonding pads PAD1, respectively. A row-directional length LX1 of the pixel array 110 may be equal to a row-directional length of the first column interlayer-connection unit 120 and the column routing wires 130 may be parallel to each other. The first column interlayer-connection unit 120 may be placed in a parallel-translated position along (i.e., may be offset in) the row direction X with respect to the pixel array 110 such that a row-directional center position CX2 of the first column interlayer-connection unit 120 is different from a row-directional center position CX1 of the pixel array 110.

The second column interlayer-connection unit 220 may be disposed in the second semiconductor die 100 at a position corresponding to the first column interlayer-connection unit 120 so that the second column interlayer-connection unit 220 may be connected to the first column interlayer-connection unit 120 when the first semiconductor die 100 and the second semiconductor die 200 are stacked. The second column interlayer-connection unit 220 may include second column bonding pads PAD2 arranged in the row direction X that are vertically aligned with and connected to the first column bonding pads PAD1 when the semiconductor dies 100 and 200 are stacked. The second column bonding pads PAD2 may be disposed on a surface of the second semiconductor die 200 that is bonded to a surface to the first semiconductor die 100 and thus, each first column bonding pads PAD1 may be disposed in face-to-face electrical contact with a second column bonding pad PAD2 as illustrated in FIG. 8.

The column control circuit 230 may include a plurality of column unit circuits CU respectively connected to the pixel columns, that is, to the column data lines CDL, through the column routing wires 130, the first column interlayer-connection unit 120 and the second column interlayer-connection unit 220. Each of the column unit circuits CU may include a comparator, a counter etc. to convert an analog signal from the corresponding column data line CDL to a digital signal. The column unit circuits CU may be arranged in the row direction X to be matched with the second column bonding pads PAD2. As a result, the pitch PTX1 between the pixels columns may be equal to the pitch PTX2 between the column unit circuits CU. The second column interlayer-connection unit 220 as well as the first column interlayer-connection unit 120 is placed in a parallel-translated position along (i.e., may be offset in) the row direction X with respect to the pixel array 110 such that the row-directional center position CX2 of the second column interlayer-connection unit 220 is different from the row-directional center position CX1 of the pixel array 110.

The design margin may be secured and restriction of the circuit disposition may be relieved if the pitch PTX2 between the column unit circuits CU is smaller than the pitch PTX1 between the pixel columns. However, the design margin is decreased and the restrictions to the circuit disposition are increased as the integration degree and the resolution of the pixel array are increased. When the pitch PTX1 between the pixel columns is about 1 μm (micrometer), it is difficult to fabricate the column unit circuits CU having the pitch PTX2 smaller than the pitch PTX1 between the pixel columns In this case, the column control circuit 230 and the row control circuit 250 would be inevitably superimposed in the second semiconductor die 200 and thus, the size of the image sensor has to be increased so that the column control circuit 230 and the row control circuit 250 are not superimposed. The stacked image sensor according to examples may increase a margin of circuit design and decrease a size of an image sensor by adopting the slide routing structure in which the routing wires are linear wires extending lengthwise in the diagonal direction.

In case of a spider routing structure in which the pitch PTX2 between the column unit circuits CU is smaller than the pitch PTX1 between the pixel columns, the operational characteristics of the image sensor may be degraded because the routing lengths are different column by column. In contrast, and according to examples of image sensors according to the inventive concept, the pitch PTX2 between the column unit circuits CU is equal to the pitch PTX1 between the pixel columns and the parallel column routing wires 130 have the same lengths. The loads along the conductive paths between the pixel array 110 and the column control circuit 230 may be uniform by virtue of the slide routing structure to enhance the performance of the stacked image sensor and the system including the stacked image sensor.

Referring to FIG. 4, the pixel rows of the pixel array 110 of the first semiconductor die 100 may be connected respectively to the row selection lines RSL as illustrated in FIG. 5. A pitch PTY1 between the pixel rows may be an interval between the two adjacent row selection lines RSL. The first row interlayer-connection unit 140 may include first row bonding pads PAD3 arranged in the column direction Y. The first row bonding pads PAD3 may be disposed on a surface of the first semiconductor die 100 that is bonded to a surface to the second semiconductor die 200. The row routing wires 150 may be of the dielectric layer of the first semiconductor die 100 and thus the row routing wires 150 may be connected to the first row bonding pads PAD3 on the surface of the first semiconductor die 100 through vertical contacts.

According to examples, the row routing wires 150 may extend linearly in the diagonal direction to connect the row selection lines RSL and the first row bonding pads PAD3, respectively. A column-directional length LY1 of the pixel array 110 may be equal to a column-directional length of the first row interlayer-connection unit 140 and the row routing wires 150 may be parallel to each other. The first row interlayer-connection unit 140 may be placed in a parallel-translated position along (i.e., may be offset in) the column direction Y with respect to the pixel array 110 such that a column-directional center position CY2 of the first row interlayer-connection unit 140 is different from a column-directional center position CY1 of the pixel array 110.

The second row interlayer-connection unit 240 may be disposed in the second semiconductor die 100 at a position corresponding to the first row interlayer-connection unit 140 so that the second row interlayer-connection unit 240 may be connected to the first row interlayer-connection unit 140 when the first semiconductor die 100 and the second semiconductor die 200 are stacked. The second row interlayer-connection unit 240 may include second row bonding pads PAD4 arranged in the column direction Y that are connected to the first row bonding pads PAD3 when the semiconductor dies 100 and 200 are stacked. The second row bonding pads PAD4 may be disposed on a surface of the second semiconductor die 200 that is bonded to a surface to the first semiconductor die 100.

The row control circuit 250 may include a plurality of row unit circuits RU respectively connected to the pixel rows, that is, to the row selection lines CDL, through the row routing wires 150, the first row interlayer-connection unit 140 and the second row interlayer-connection unit 240. Each of the row unit circuits RU may include a driver to apply a predetermined voltage to the corresponding row selection line RSL. The row unit circuits RU may be arranged in the column direction Y to be matched with the second row bonding pads PAD4. As a result, the pitch PTY1 between the pixels rows may be equal to the pitch PTY2 between the row unit circuits RU. The second row interlayer-connection unit 240 as well as the first row interlayer-connection unit 140 is placed in a parallel-translated position along (i.e., may be offset in) the column direction Y with respect to the pixel array 110 such that the column-directional center position CY2 of the second row interlayer-connection unit 240 may be different from the column-directional center position CY1 of the pixel array 110.

In the examples described above, implementing a slide routing structure as the row routing wires 150 and/or the column routing wires 130 in a stacked image sensor according to the inventive concept, maximizes the margin of circuit design and allows the size of the image sensor to by minimized FIG. 5 is a block diagram illustrating an example of the elements of dies in a stacked image sensor according to the inventive concept.

Referring to FIG. 5, a stacked image sensor 10 may include a first semiconductor die 100 and a second semiconductor die 200. As described above, a pixel array 110 may be provided in the first semiconductor die 100 and other circuits such as a column control circuit CCC 230, a row control circuit RCC 250, a timing controller TMC 260, a reference signal generator REF 270, a digital circuit DGT 280, etc. may be provided in the second semiconductor die 200.

The pixel array 110 may include a plurality of pixels PX that are arranged in a plurality of pixel rows and a plurality of pixel columns. The configuration and the operation of the pixels PX are described below with reference to FIGS. 7A through 7D. The pixels PX in the same pixel row may be commonly connected to a respective row selection line RSL and the pixels PX in the same pixel column may be commonly connected to a respective column data line CDL.

A first column interlayer-connection unit 120 and column routing wires 130 of the first semiconductor die 100 and a second column interlayer-connection unit 220 of the second semiconductor die 200 may connect the pixel columns of the pixel array 110 disposed in the first semiconductor die 100 and the column control circuit 230 disposed in the second semiconductor die 200. A first row interlayer-connection unit 140 and row routing wires 150 of the first semiconductor die 100 and a second row interlayer-connection unit 240 of the second semiconductor die 200 may connect the pixel rows of the pixel array 110 of the first semiconductor die 100 and the row control circuit 250. As described above, the column routing wires 130 and/or the row routing wires 150 may have a slide routing structure, i.e., all of the column routing wires 130 and/or all of the row routing wires 150 may be linear wires extending parallel to each other in a diagonal direction.

The column control circuit 230 may include comparators, counters and correlated double sampling circuits to convert the analog signals from the pixel columns in the pixel array 110 to digital signals. The row control circuit 250 may include drivers to apply predetermined voltages to the pixel rows in the pixel array 110. The reference signal generator 270 may generate a reference signal such as a ramp signal that is provided to the column control circuit 230. The digital circuit 280 may include an image signal processor to process the digital signals form the column control circuit 230, an interface circuit to input and out signals, a voltage providing circuit, etc. The timing controller 260 may generate control signals to control overall operations of the stacked image sensor 10 and the control signals may be provided to the corresponding circuits.

Figure 6A:
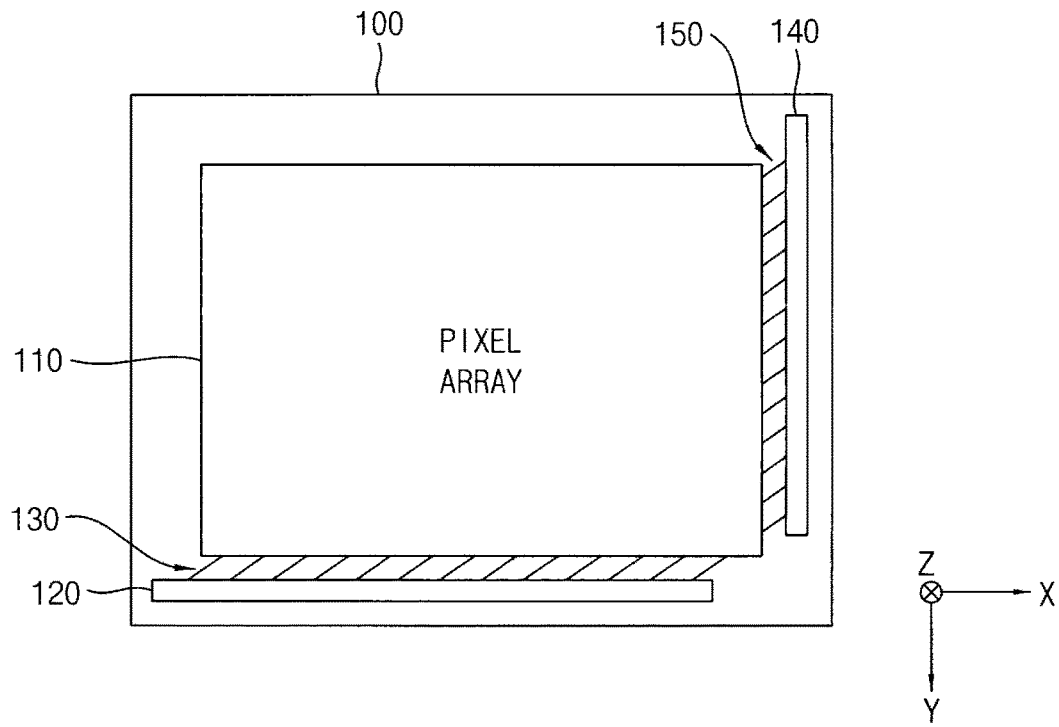
FIGS. 6A and 6B are diagrams illustrating a layout of a stacked image sensor according to examples.
Figure 6B:
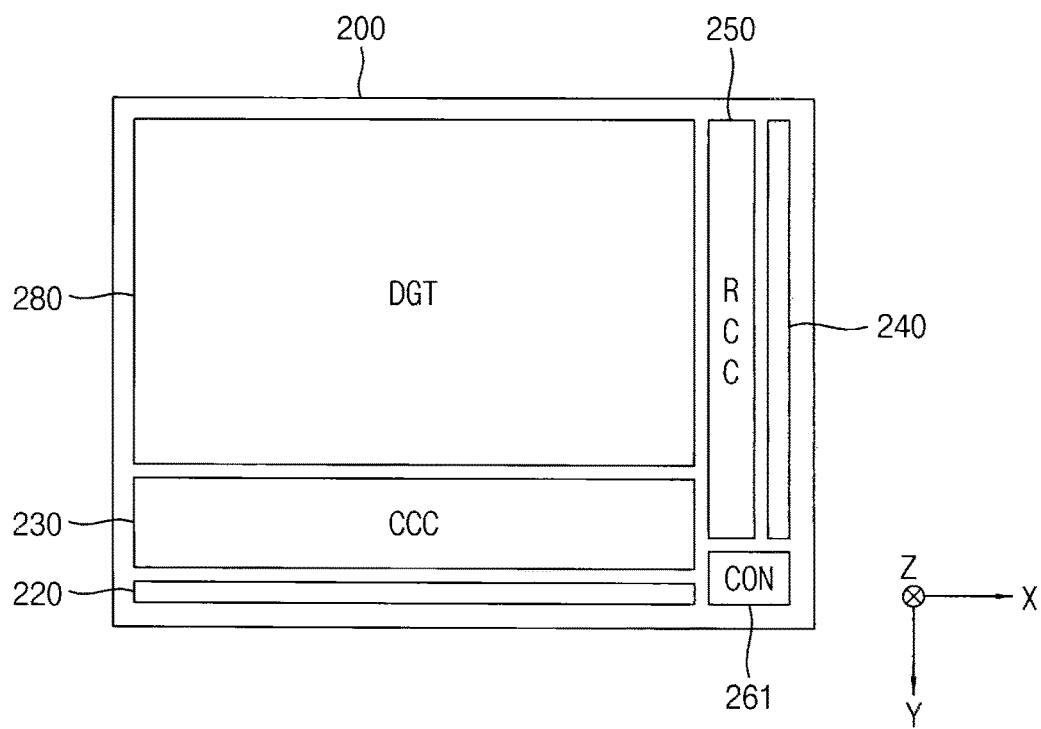

FIGS. 6A and 6B are diagrams illustrating a layout of a stacked image sensor according to examples.

Referring to FIGS. 6A and 6B, a first semiconductor die 100 may include a pixel array 110, a first column interlayer-connection unit 120, column routing wires 130, a first row interlayer-connection unit 140 and row routing wires 150. A second semiconductor die 200 may include a second column interlayer-connection unit 220, a column control circuit CCC 230, a second row interlayer-connection unit 240, a row control circuit RCC 250 and a digital circuit DGT 280

As described above, the column routing wires 130 and/or the row routing wires 150 may have the slide routing structure such that the wires extend linearly in a diagonal direction. The diagonal direction may be an arbitrary direction that is parallel with the top and bottom surfaces of the semiconductor die and is not parallel with the row direction X and the column direction Y. Using such slide routing structure, the stacked image sensor 10 may maximize a margin of circuit design and the size of the image sensor may be minimized In addition, the loads along the conductive paths between the pixel array 110 and the column control circuit 230 and/or between the pixel array 110 and the row control circuit 250 may be uniform to enhance the performance of the stacked image sensor 10 and the system including the stacked image sensor 10.

As illustrated in FIG. 6B, the column control circuit 230 may be disposed adjacent to the second column interlayer-connection unit 220 and the row control circuit 250 may be disposed adjacent to the second row interlayer-connection unit 240. As described with reference to FIG. 3, the column control circuit 230 may include the column unit circuits CU corresponding to the pixel columns The column unit circuits CU may be arranged in the row direction to be matched with the second column bonding pads PAD2 in the second column interlayer-connection unit 220. As described with reference to FIG. 4, the row control circuit 250 may include the row unit circuits RU corresponding to the pixel rows. The row unit circuits RU may be arranged in the column direction to be matched with the second row bonding pads PAD4 in the second row interlayer-connection unit 240.

The digital circuit 280 may occupy a relatively wide area because it includes various circuits such as an image signal processor, a storage block, an interface circuit, a voltage providing circuit, etc. In designing the stacked image sensor, the column control circuit 230 and the row control circuit 250 are laid out first and then the digital circuit 280 may be laid out in the remaining region of the die 200.

In an example, as illustrated in FIGS. 6A and 6B, the first column interlayer-connection unit 120 may be offset in one horizontal direction parallel to an upper surface of the die 100 (to the left in the figure) with respect to the pixel array 110 and the first row interlayer-connection unit 140 may be offset in another horizontal direction (upwards in the figure) with respect to the pixel array 110. In this case, an unoccupied region may be secured in a corner of the die 100 corresponding to a corner region CON 261 of the die 200 (right-bottom portion of the second semiconductor die 200 in the figure). The timing controller for controlling overall operations of the stacked image sensor and/or the reference signal generator for providing the reference signal to the column control circuit 230 may be disposed in the corner region CON 261 of the second semiconductor die 200. As such, the circuits are disposed efficiently and the size of the image sensor is minimized FIGS. 7A through 7D are diagrams illustrating examples of pixels employed in the stacked image sensor of FIG. 5.

The pixels 20a, 20b, 20c and 20d illustrated in FIGS. 7A, 7B, 7C and 7D may be color pixels for detecting color image information or depth pixels for detecting distance information.

Figure 7A:
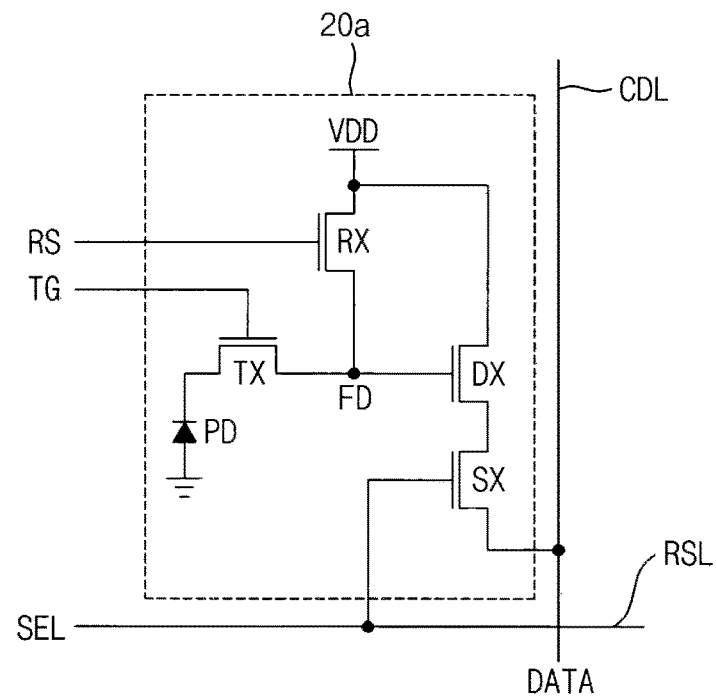
FIGS. 7A through 7D are diagrams illustrating example pixels included in the stacked image sensor of FIG. 5.

Referring to FIG. 7A, the pixel 20a may include a photo-sensitive element such as a photodiode PD, and a readout circuit including a transfer transistor TX, a reset transistor RX, a drive transistor DX and a selection transistor SX.

For example, the photodiode PD may include an n-type region in a p-type substrate such that the n-type region and the p-type substrate form a p-n junction diode. The photodiode PD receives the incident light and generates a photocharge based on the incident light. In some examples, the pixel 20a may include a photo transistor, a photo gate, a pinned photo diode, etc. instead of or in addition to the photodiode PD.

The photo-charge generated in the photodiode PD may be transferred to a floating diffusion node FD through the transfer transistor TX, which is turned on in response to a transfer control signal TG The drive transistor DX functions as a source follower amplifier that amplifies a signal corresponding to the charge on the floating diffusion node FD. The selection transistor SX may transfer the amplified signal to a column data line CDL in response to a selection signal SEL that is provided through a row selection line RSL. The floating diffusion node FD may be reset by the reset transistor RX. For example, the reset transistor RX may discharge the floating diffusion node FD in response to a reset signal RS for correlated double sampling (CDS).

The pixels in the same row may be connected commonly to a respective row selection line to form a pixel row. The pixels in the same column may be connected commonly to the a respective column data line to form a pixel column.

FIG. 7A illustrates the pixel 20a as having a four-transistor configuration including the four transistors TX, RX, DX and SX. Pixels of an image sensor according to the inventive concept may, however, have other configurations as illustrated in FIGS. 7B, 7C and 7D.

Figure 7B:
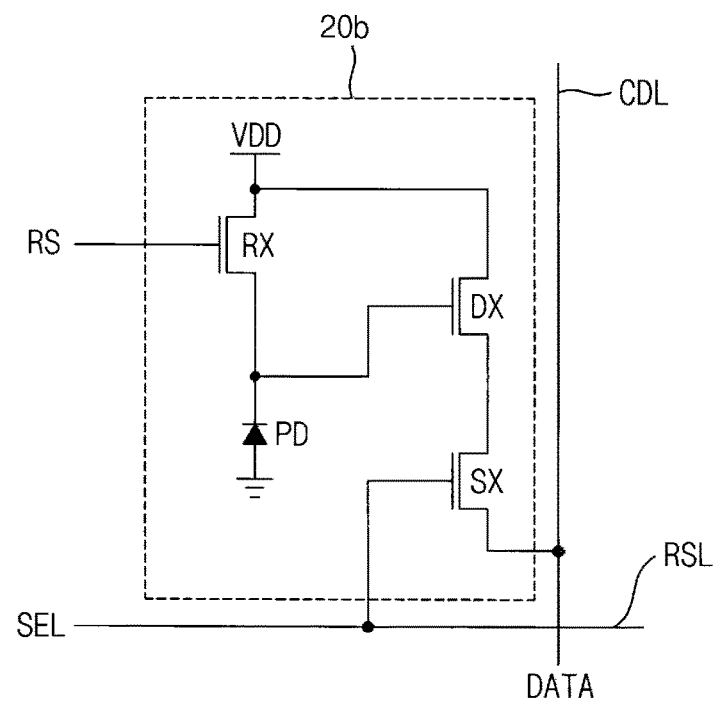

Referring to FIG. 7B, the pixel 20b may have the three-transistor configuration including a photo-sensitive element such as a photodiode PD, and a readout circuit including a reset transistor RX, a drive transistor DX and a selection transistor SX.

Figure 7C:
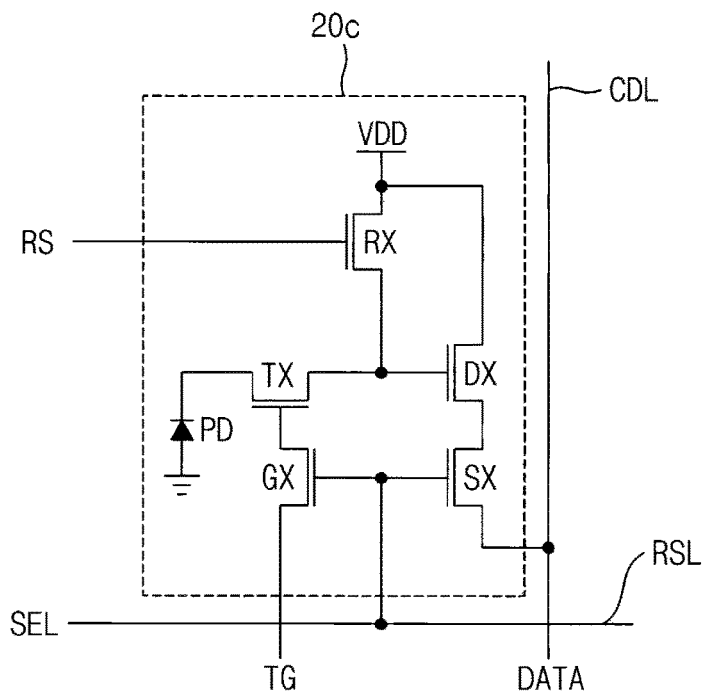

Referring to FIG. 7C, the pixel 20c may have the five-transistor configuration including a photo-sensitive element such as a photodiode PD, and a readout circuit including a transfer transistor TX, a gate transistor GX, a reset transistor RX, a drive transistor DX and a selection transistor SX. The gate transistor GX may selectively apply the transfer control signal TG to the transfer transistor TX in response to the selection signal SEL.

Figure 7D:
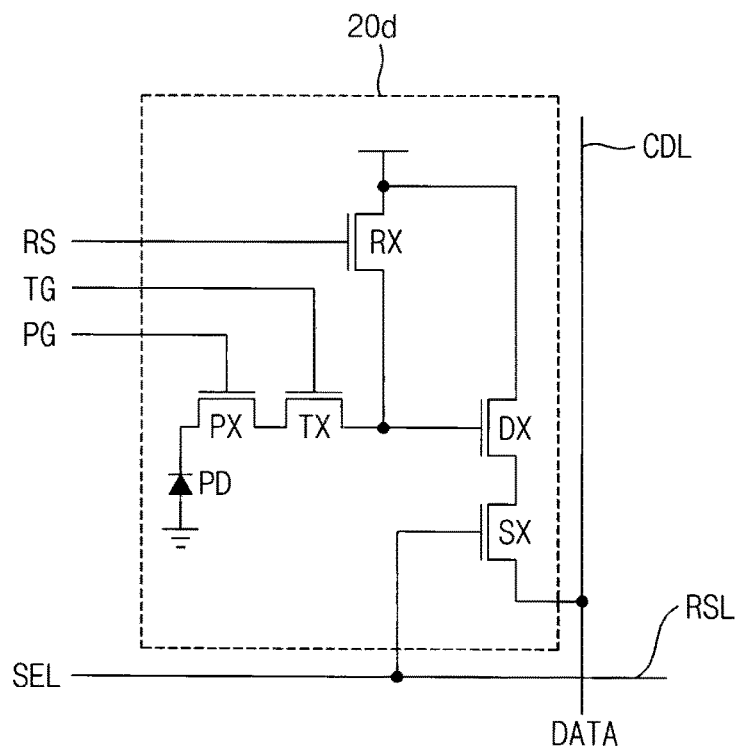

Referring to FIG. 7D, the pixel 20d may have the five-transistor configuration including a photo-sensitive element such as a photodiode PD, and a readout circuit including a photo transistor PX, a transfer transistor TX, a reset transistor RX, a drive transistor DX and a selection transistor SX. The photo transistor PX may be turned on or off in response to a photo gate signal PG The pixel 20d may be enabled when the photo transistor PX is turned on and disabled when the photo transistor PX is turned off. In addition, the pixel may have six-transistor configuration, e.g., may further include the gate transistor GX of FIG. 7C (or a bias transistor) in addition to the transistors of the configuration of FIG. 7D.

Figure 9:
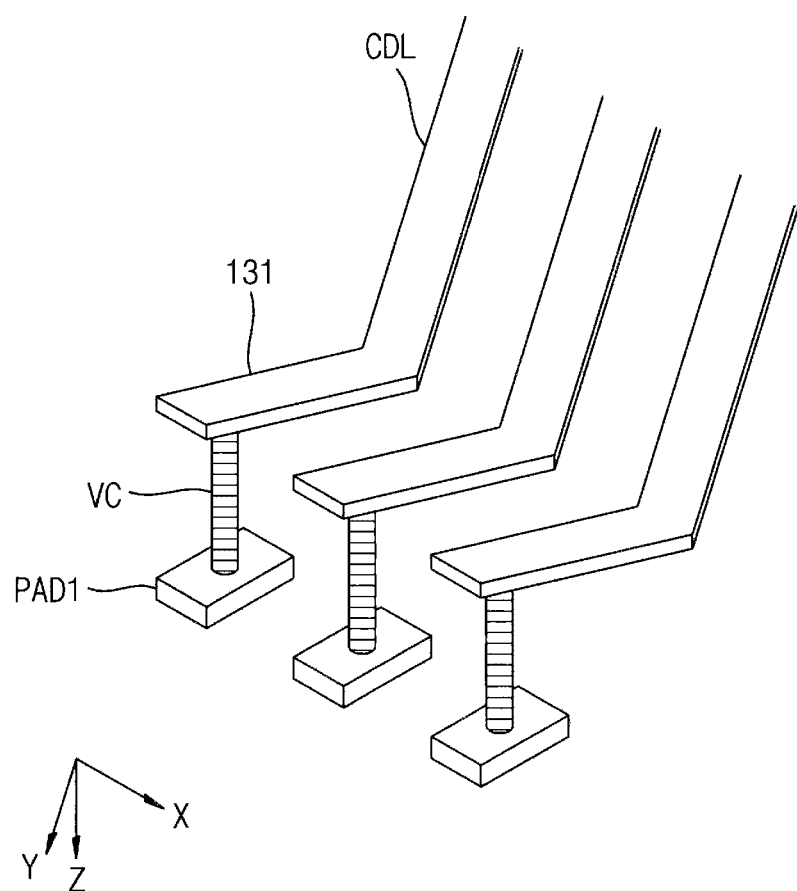
FIG. 9 is a diagram illustrating a slide routing structure implemented in the stacked image sensor of FIG. 8.

FIG. 8 is a cross-sectional view of a stacked image sensor according to an example, and FIG. 9 is a diagram illustrating a slide routing structure implemented in the stacked image sensor of FIG. 8.

Referring to FIG. 8, a stacked image sensor 11 may include a first semiconductor die 101 and a second semiconductor die 201 that are stacked in a vertical direction Z.

The first semiconductor die 101 includes a first semiconductor substrate SUB1 and a first dielectric layer DLY1 formed on the first semiconductor substrate SUB1. The pixels PX are part of the first semiconductor substrate SUB1 and first conductive paths connected to the pixels PX are provided in the first dielectric layer DLY1. The column data line CDL, the column routing wire 131 and vertical contacts VC, as examples of elements that form the first conductive paths, are illustrated in FIG. 8. The column data line CDL may be connected to the pixels PX through the vertical contacts VC. The vertical contacts may be connected to the active regions AR of the pixels PX. Color filters CF and micro-lenses may be disposed on the pixels PX to receive incident light.

The second semiconductor die 201 includes a second semiconductor substrate SUB2 and a second dielectric layer DLY2 formed on the second semiconductor substrate SUB2. The column unit circuit CU is part of the second semiconductor substrate SUB2 and second conductive paths connected to the column unit circuit CU are provided in the second dielectric layer DLY2. Metal patterns MP and vertical contacts VC, as examples of the elements that provide the second conductive paths, are illustrated in FIG. 8. The column routing wires 131 may be connected to the column unit circuit CU through the vertical contacts VC and the metal patterns MP.

As illustrated in FIG. 8, the first semiconductor die 101 and the second semiconductor die 201 may be stacked such that a top surface of the first dielectric layer DLY1 and a top surface of the second dielectric layer DLY2 are bonded to each other. In other words, the first semiconductor die 101 may be stacked in an upside-down state. As a result, the stacked image sensor 11 may be a back-side-illuminated sensor such that incident light rays are received through a bottom surface of the first semiconductor substrate SUB1.

The first column interlayer-connection unit 120 may include first column bonding pads PAD1 arranged in the row direction X on the top surface of the first dielectric layer DLY1 and first vertical contacts VC connecting the column routing wires 131 of the first dielectric layer DLY1 and the first column bonding pads PAD1. The second column interlayer-connection unit 220 may include second column bonding pads PAD2 arranged in the row direction X on the top surface of the second dielectric layer DLY2 and second vertical contacts VC connecting the column control circuit, that is, the column unit circuits CU of the second semiconductor substrate SUB2 and the second column bonding pads PAD2. Vertical contacts VC at different levels and horizontal positions may be connected by the metal patterns MP.

As illustrated in FIGS. 8 and 9, the column data lines CDL and the column routing wires 131 may be of the same metal layer. In this case, each column data line CDL and each column routing wire 131 may be formed monolithically through the same metallization process. The column routing wires 131 may extend in the diagonal direction and parallel to each other. Accordingly the column data lines CDL, the column routing wires 131, the first column interlayer-connection unit 120 and the second column interlayer-connection unit 220 corresponding to the respective columns may be contiguous and constitute a unitary structure. The loads along the conductive paths between the pixel array and the column control circuit may be kept uniform by using the slide routing structure to enhance the performance of the stacked image sensor and the system including the stacked image sensor.

Figure 10:
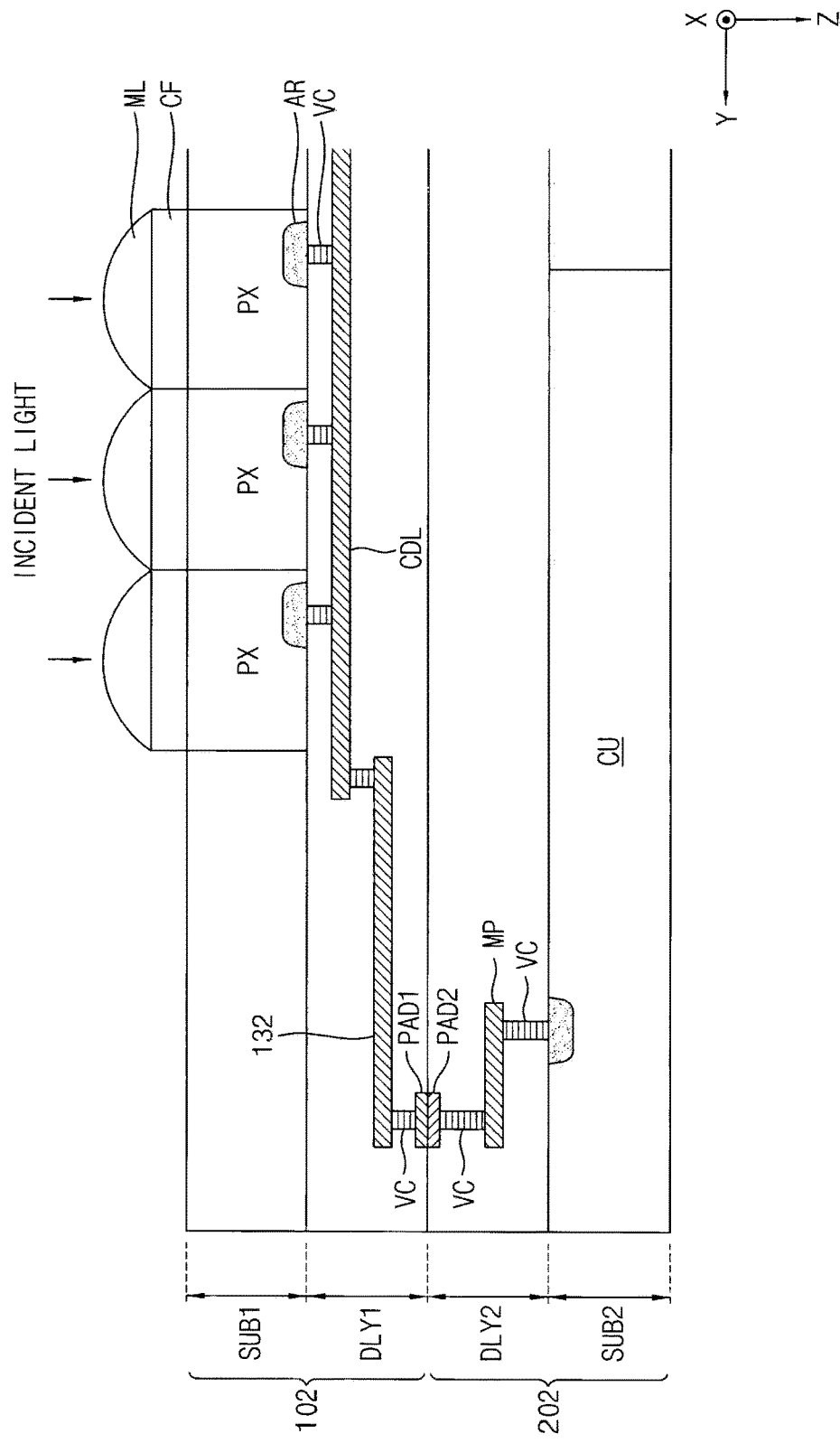
FIG. 10 is a cross-sectional view of a stacked image sensor according to an example.
Figure 11:
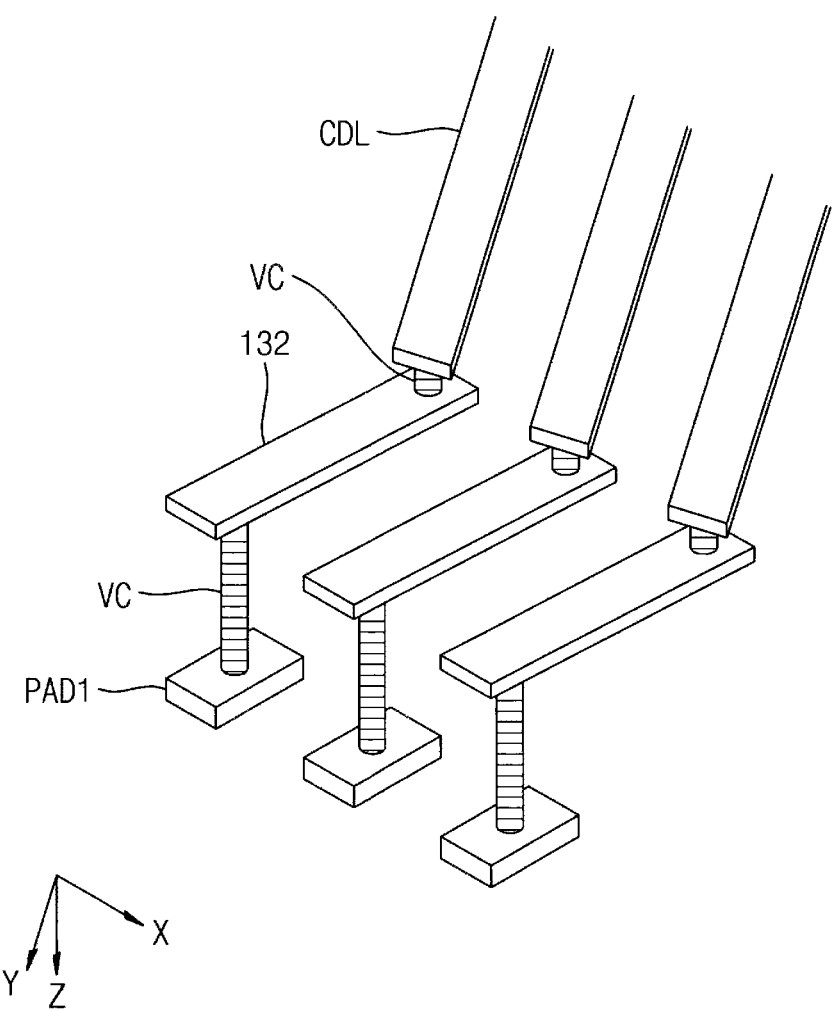
FIG. 11 is a diagram illustrating a slide routing structure implemented in the stacked image sensor of FIG. 10.

FIG. 10 is a cross-sectional view of a stacked image sensor according to another example, and FIG. 11 is a diagram illustrating a slide routing structure in the stacked image sensor of FIG. 10.

Referring to FIG. 10, a stacked image sensor 12 may include a first semiconductor die 102 and a second semiconductor die 202 that are stacked in a vertical direction Z.

The first semiconductor die 102 includes a first semiconductor substrate SUB1 and a first dielectric layer DLY1 formed on the first semiconductor substrate SUB1. The pixels PX are part of the first semiconductor substrate SUB1 and first conductive paths connected to the pixels PX are provided in the first dielectric layer DLY1. The column data line CDL, the column routing wire 132 and vertical contacts VC, as examples of the elements providing the first conductive paths, are illustrated in FIG. 10. The column data line CDL may be connected to the pixels PX through the vertical contacts VC. The vertical contacts may be connected to the active regions AR of the pixels PX. Color filters CF and micro-lenses may be disposed on the pixels PX to receive incident light.

The second semiconductor die 202 includes a second semiconductor substrate SUB2 and a second dielectric layer DLY2 formed on the second semiconductor substrate SUB2. The column unit circuit CU is part of the second semiconductor substrate SUB2 and second conductive paths connected to the column unit circuit CU are provided in the second dielectric layer DLY2. The metal patterns MP and the vertical contacts VC, as examples of the elements providing the second conductive paths, are illustrated in FIG. 10. The column routing wire 132 may be connected to the column unit circuit CU through the vertical contacts VC and the metal patterns MP.

As illustrated in FIG. 10, the first semiconductor die 102 and the second semiconductor die 202 may be stacked such that a top surface of the first dielectric layer DLY1 and a top surface of the second dielectric layer DLY2 are bonded to each other. In other words, the first semiconductor die 102 may be stacked in an upside-down state. As a result, the stacked image sensor 12 may be a back-side-illuminated sensor such that the incident light rays are received through a bottom surface of the first semiconductor substrate SUB 1.

The first column interlayer-connection unit 120 may include first column bonding pads PAD1 arranged in the row direction X on the top surface of the first dielectric layer DLY1 and first vertical contacts VC connecting the column routing wires 131 of the first dielectric layer DLY1 and the first column bonding pads PAD1. The second column interlayer-connection unit 220 may include second column bonding pads PAD2 arranged in the row direction X on the top surface of the second dielectric layer DLY2 and second vertical contacts VC connecting the column control circuit, that is, the column unit circuits CU of the second semiconductor substrate SUB2 and the second column bonding pads PAD2. Vertical contacts VC at different levels and horizontal positions may be connected through the metal patterns MP.

As illustrated in FIGS. 10 and 11, the column data lines CDL and the column routing wires 131 may be of different metal layers. In this case, each column data line CDL and each column routing wire 131 may be formed sequentially through different metallization processes and the vertical contacts connecting the column data lines CDL and the column routing wires 130 may be further formed. The column routing wires 132 may extend in the diagonal direction and parallel to each other. Accordingly the column data lines CDL, the column routing wires 132, the first column interlayer-connection unit 120 and the second column interlayer-connection unit 220 corresponding to the respective columns may together form an integral structure. The loads along the conductive paths between the pixel array and the column control circuit may be kept uniform by the slide routing structure to enhance the performance of the stacked image sensor and the system including the stacked image sensor.

Figure 12:
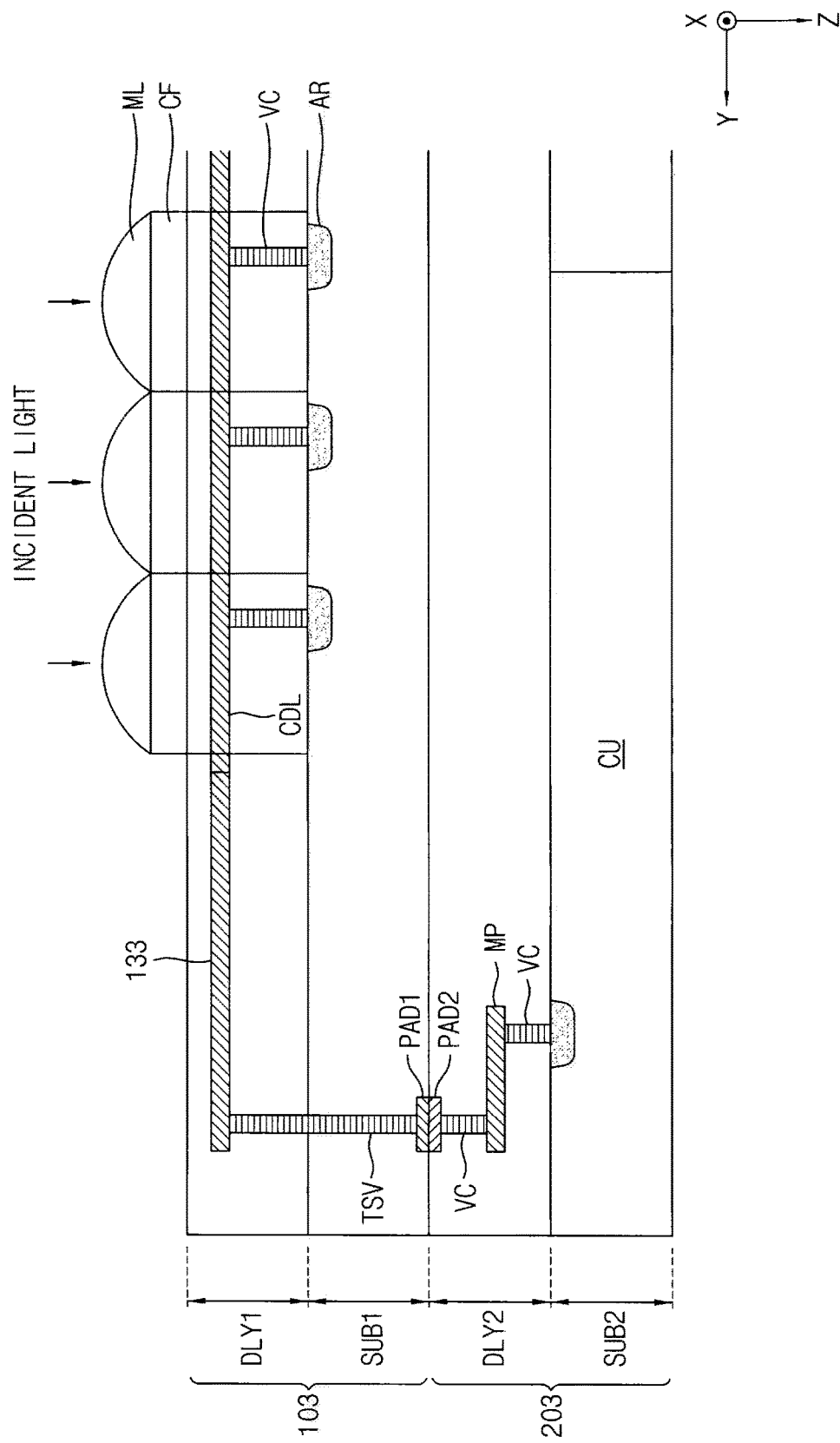
FIG. 12 is a cross-sectional view of a stacked image sensor according to an example.

FIG. 12 is a cross-sectional view of a stacked image sensor according to another example.

Referring to FIG. 12, a stacked image sensor 13 may include a first semiconductor die 103 and a second semiconductor die 203 that are stacked in a vertical direction Z.

The first semiconductor die 103 includes a first semiconductor substrate SUB1 and a first dielectric layer DLY1 formed on the first semiconductor substrate SUB1. The pixels PX are part of the first semiconductor substrate SUB1 and first conductive paths connected to the pixels PX are provided by the first dielectric layer DLY1. The column data line CDL, the column routing wire 133 and vertical contacts VC, as examples of elements that provide the first conductive paths, are illustrated in FIG. 12. The column data line CDL may be connected to the pixels PX through the vertical contacts VC. The vertical contacts may be connected to the active regions AR of the pixels PX. Color filters CF and micro-lenses may be disposed on the pixels PX to receive incident light.

The second semiconductor die 203 includes a second semiconductor substrate SUB2 and a second dielectric layer DLY2 formed on the second semiconductor substrate SUB2. The column unit circuit CU is part of the second semiconductor substrate SUB2 and second conductive paths connected to the column unit circuit CU are provided by the second dielectric layer DLY2. The metal patterns MP and the vertical contacts VC, as examples of elements that provide, the second conductive paths are illustrated in FIG. 12. The column routing wire 133 may be connected to the column unit circuit through the vertical contacts VC and the metal patterns MP.

As illustrated in FIG. 12, the first semiconductor die 103 and the second semiconductor die 203 may be stacked such that a bottom surface of the first semiconductor substrate SUB1 and a top surface of the second dielectric layer DLY2 are bonded to each other. In other words, the first semiconductor die 103 may stacked right side up. As a result, the stacked image sensor 13 may be a front-side-illuminated sensor such that the incident light rays are received through a top surface of the first dielectric layer DLY1.

The first column interlayer-connection unit 120 may include first column bonding pads PAD1 arranged in the row direction X on the bottom surface of the first semiconductor substrate SUB and through-substrate vias TSV penetrating the first semiconductor substrate SUB1 to connect the column routing wires 133 of the first dielectric layer DLY1 and the first column bonding pads PAD1. The second column interlayer-connection unit 220 may include second column bonding pads PAD2 arranged in the row direction X on the top surface of the second dielectric layer DLY2 and second vertical contacts VC connecting the column control circuit, that is, the column unit circuits CU of the second semiconductor substrate SUB2 and the second column bonding pads PAD2. Vertical contacts VC at different levels and horizontal positions may be connected by the metal patterns MP.

The column data lines CDL and the column routing wires 133 may be of the same metal layer as described with reference to FIGS. 8 and 9 or may be of different metal layers as described with reference to FIGS. 10 and 11. The column routing wires 133 may extend in the diagonal direction and parallel to each other. Accordingly the column data lines CDL, the column routing wires 133, the first column interlayer-connection unit 120 and the second column interlayer-connection unit 220 corresponding to the respective columns may together constitute and unitary or integral structure. The loads along the conductive paths between the pixel array and the column control circuit may be kept uniform by the slide routing structure to enhance the performance of the stacked image sensor and the system including the stacked image sensor.

The examples of FIGS. 8 through 12 have been described with reference to the column routing wires being in the form of a slide routing structure. In the same way, the row routing wires may be implemented in the form of a slide routing structure.

Figure 13:
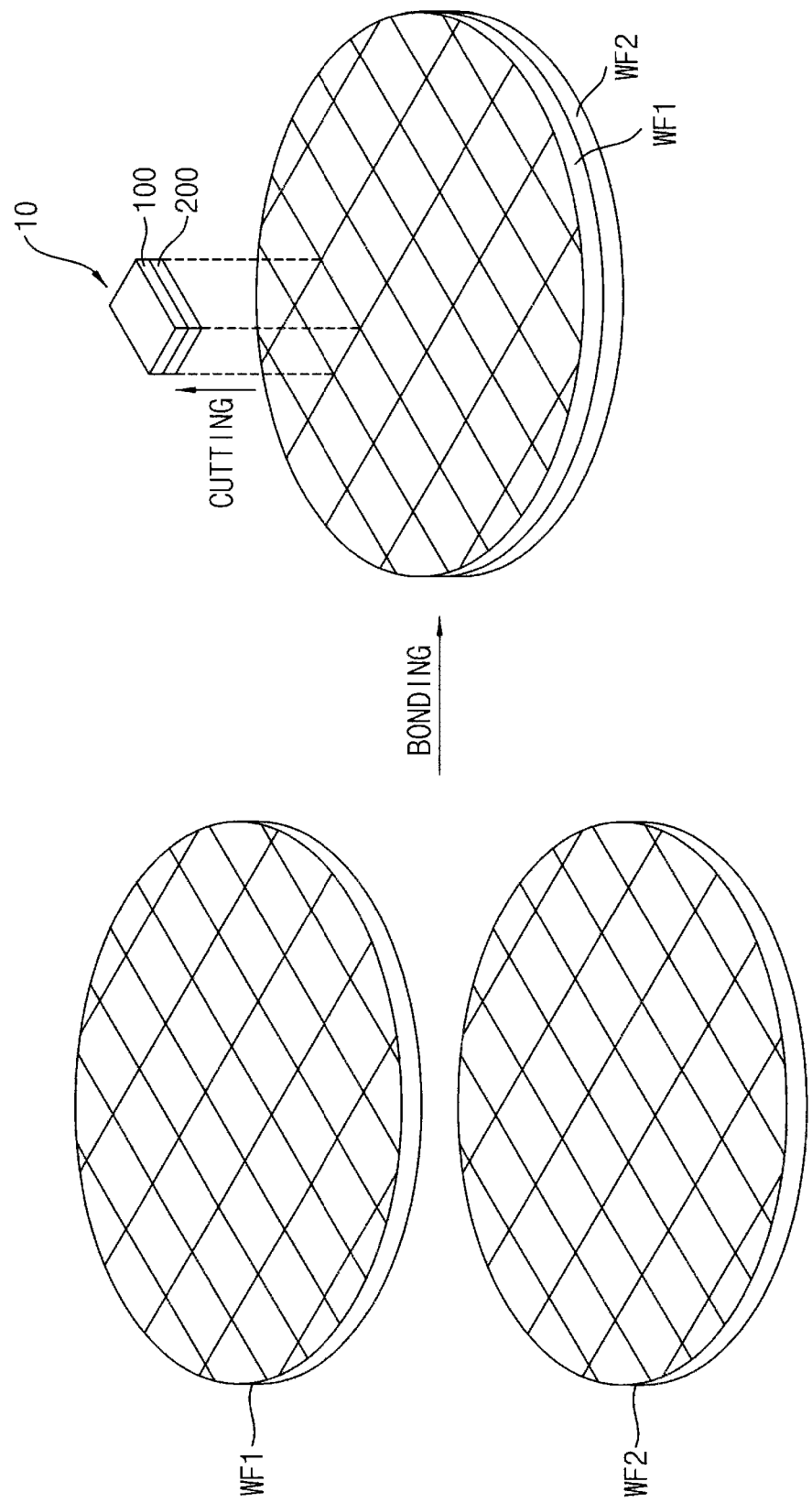
FIG. 13 is a diagram for describing manufacturing processes of a stacked image sensor according to examples.

FIG. 13 is a diagram of an example of manufacturing processes of a stacked image sensor.

Referring to FIG. 13, a plurality of pixel arrays may be formed as parts (dies) of a first wafer WF1 and other circuits may be formed as parts (dies) of a second wafer WF2. According to examples, the pixels arrays of the first wafer WF1 may be connected to the circuits in the second wafer WF2 using slide routing structure. After the pixel arrays and the other circuits have been fabricated, the first wafer WF1 and the second wafer WF2 are bonded. The above-mentioned first column and row bonding pads PAD1 and PAD3 may be formed at a bottom surface of the first wafer WF1 and the above-mentioned second column and row bonding pads PAD2 and PAD4 may be formed at a top surface of the second wafer WF2. The first and second wafers WF1 and WF2 may be aligned so that the corresponding pads may be bonded to each other. The bonded wafers WF1 and WF2 are cut and divided into a plurality of chips where each chip corresponds to the above-mentioned stacked image sensor 10. Each separated portion of the wafer WF1 corresponds to the above-mentioned first semiconductor die 100 and each separated portion of the second wafer WF2 corresponds to the above-mentioned second semiconductor die 200.

Figure 14:
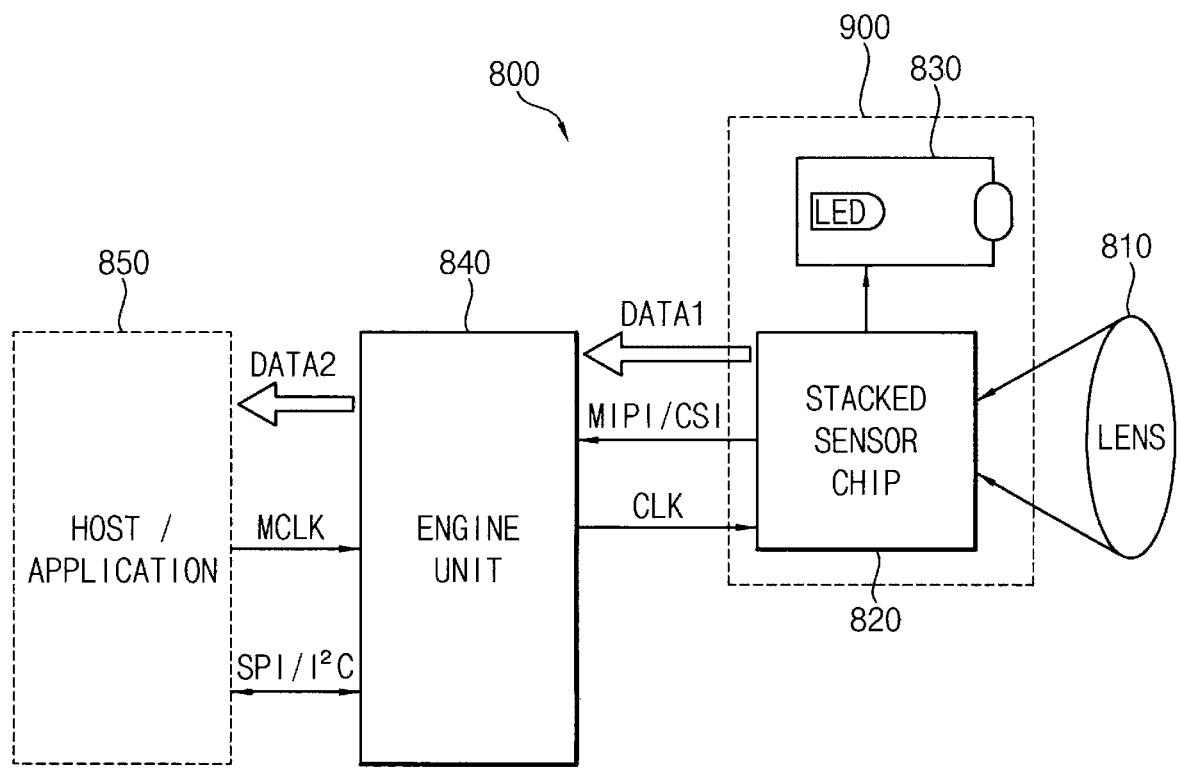
FIG. 14 is a diagram illustrating a camera system including a stacked image sensor according to examples.

FIG. 14 is a diagram illustrating an example of a camera system including a stacked image sensor according to the inventive concept.

Referring to FIG. 14, a camera system 800 may include a photo-receiving lens 810, an image capturing device 900 and an engine unit 840. The image capturing device 900 may include a stacked image sensor chip 820 and a light source module 830. According to examples, the stacked image sensor chip 820 may include the slide routing structure so as to be miniaturized and offer an enhanced performance. The stacked image sensor chip 820 and the light source module 830 may be separated devices, or at least a portion of the light source module 830 may be provided as part of the stacked image sensor chip 820. In some examples, the photo-receiving lens 810 may be part of the three-dimensional image sensor chip 820.

The photo-receiving lens 810 may focus incident light on a photo-receiving region (e.g., depth pixels and/or color pixels of a pixel array) of the stacked image sensor chip 820. The stacked image sensor chip 820 may generate data DATA1 including depth information and/or color image information based on the incident light passing through the photo-receiving lens 810. For example, the data DATA1 generated by the stacked image sensor chip 820 may include depth data generated using infrared light or near-infrared light emitted from the light source module 830 and red, green, blue (RGB) data of a Bayer pattern generated using external visible light. The stacked image sensor chip 820 may provide the data DATA1 to the engine unit 840 based on a clock signal CLK. In some examples, the stacked image sensor chip 820 may interface with the engine unit 840 via mobile industry processor interface (MIPI®) and/or camera serial interface (CSI).

The engine unit 840 controls the image capturing device 900. The engine unit 840 may process the data DATA1 received from the three-dimensional image sensor chip 820. For example, the engine unit 840 may generate three-dimensional color data based on the data DATA1 received from the stacked image sensor chip 820. In other examples, the engine unit 840 may generate luminance, chrominance (YUV) data including a luminance component Y, a blue-luminance difference component U, and a red-luminance difference component V based on the RGB data included in the data DATA1, or compressed data, such as Joint Photographic Experts Group (JPEG) data. The engine unit 840 may be connected to a host/application 850 and may provide data DATA2 to the host/application 850 based on a master clock MCLK. Furthermore, the engine unit 840 may interface with the host/application 850 via serial peripheral interface (SPI) and/or inter integrated circuit (I2C).

Figure 15:
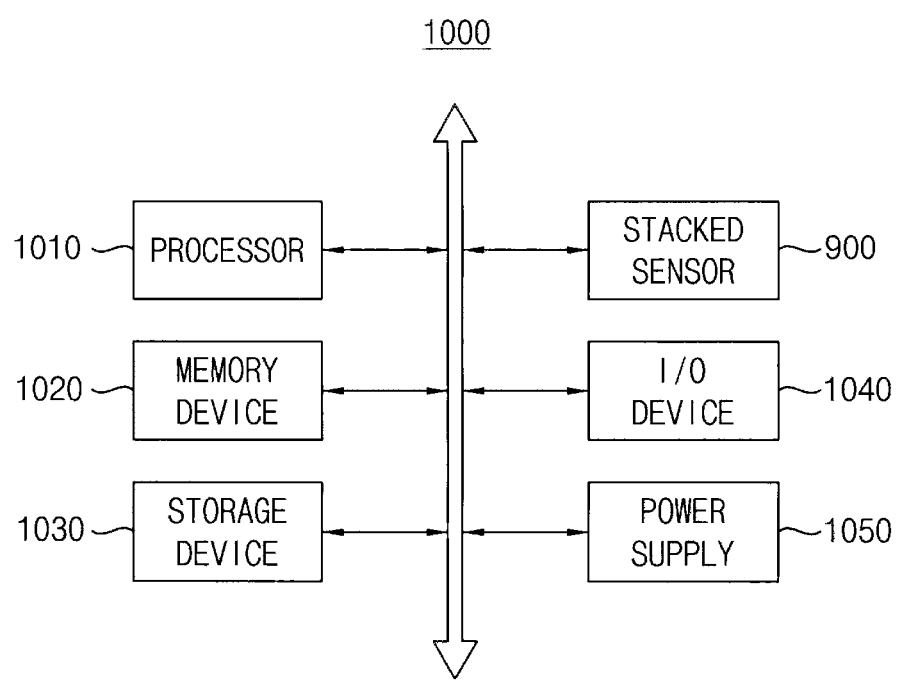
FIG. 15 is a diagram illustrating a computer system including a stacked image sensor according to examples.

FIG. 15 is a diagram illustrating an example of a computer system including a stacked image sensor according to the inventive concept.

Referring to FIG. 15, a computer system 1000 may include a processor 1010, a memory device 1020, a storage device 1030, an input/output device 1040, a power supply 1050, and a stacked image sensor 900. Although not illustrated in FIG. 15, the computer system 1000 may further include ports that communicate with a video card, a sound card, a memory card, a universal serial bus (USB) device, and/or other electronic devices.

The processor 1010 may perform various calculations or tasks. The processor 1010 may be a microprocessor or a central processing unit (CPU). The processor 1010 may communicate with the memory device 1020, the storage device 1030, and the input/output device 1040 via an address bus, a control bus, and/or a data bus. In some examples, the processor 1010 may be coupled to an extended bus, such as a peripheral component interconnection (PCI) bus. The memory device 1020 may store data for operating the computer system 1000. For example, the memory device 1020 may comprise a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device may comprise a solid state drive (SSD), a hard disk drive (HDD), a compact-disc read-only memory (CD-ROM), or the like. The input/output device 1040 may include an input device (e.g., a keyboard, a keypad, or a mouse) and an output device (e.g., a printer or a display device). The power supply 1050 supplies operation voltages for the computer system 1000.

The stacked image sensor 900 may communicate with the processor 1010 via the buses or other communication links. The stacked image sensor 900 may be integrated with the processor 1010 in one chip, or the stacked image sensor 900 and the processor 1010 may be separate chips. According to examples, the stacked image sensor 900 may include the slide routing structure so as to be miniaturized and offer an enhanced performance.

The computer system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP).

The computer system 1000 may be any system having an image sensor. For example, the computer system 1000 may be a digital camera, a mobile phone, a smart phone, a portable multimedia player (PMP), or a personal digital assistant (PDA).

Figure 16:
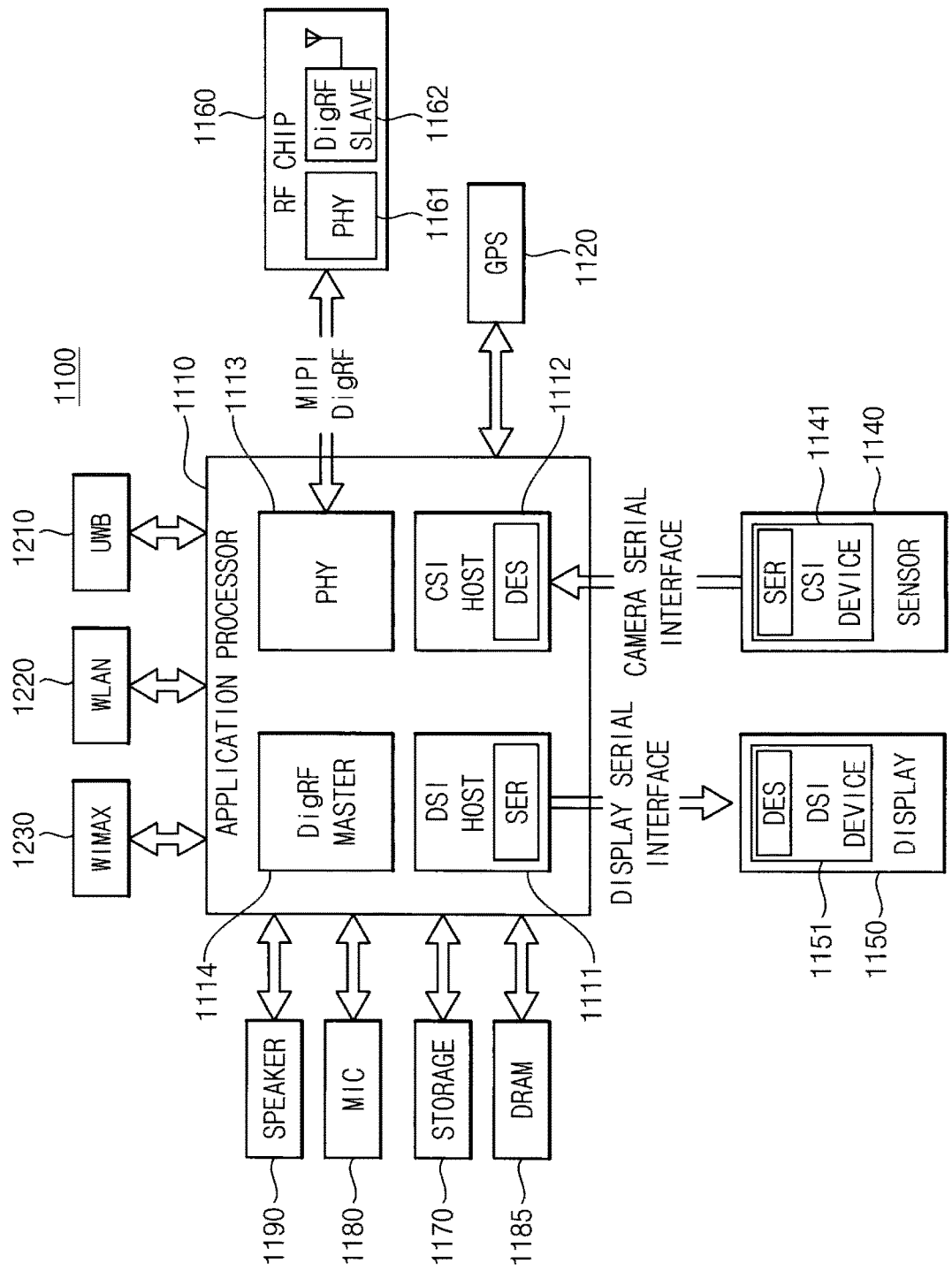
FIG. 16 is a block diagram illustrating an interface employable in the computer system of FIG. 15.

FIG. 16 is a block diagram illustrating a computer system of a type more generally shown in FIG. 15.

Referring to FIG. 16, a computer system 1100 may be a data processing device that uses or supports a mobile industry processor interface (MIPI®) interface. The computer system 1100 may include an application processor 1110, a three-dimensional image sensor 1140, a display device 1150, etc. A CSI host 1112 of the application processor 1110 may perform a serial communication with a CSI device 1141 of the three-dimensional image sensor 1140 via a camera serial interface (CSI). In some examples, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some examples, the DSI host 1111 may include a serializer (SER), and the DSI device 1151 may include a deserializer (DES). The computer system 1100 may further include a radio frequency (RF) chip 1160 performing a communication with the application processor 1110 and a DigRFSM slave 1162 providing communication with other devices. A physical layer (PHY) 1113 of the computer system 1100 and a physical layer (PHY) 1161 of the RF chip 1160 may perform data communications based on a MIPI® DigRFSM. The application processor 1110 may further include a DigRFSM MASTER 1114 that controls the data communications of the PHY 1161.

The computer system 1100 may further include a global positioning system (GPS) 1120, a storage 1170, a MIC 1180, a DRAM device 1185, and a speaker 1190. In addition, the computer system 1100 may perform communications using an ultra-wideband (UWB) 1210, a wireless local area network (WLAN) 1220, and a worldwide interoperability for microwave access (WIMAX) 1230. However, the structure and the interface of the computer system 1100 are not limited thereto.

The inventive concept may be applied to various devices and systems. For example, the inventive concept may be applied to a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, or a navigation system.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. An image sensor comprising first and second dies stacked one on the other and joined to each other,
the first die including a semiconductor substrate, a pixel array, and routing wires, and
the second die including a semiconductor substrate, and pixel array control circuitry, and
wherein the pixel array comprises rows and columns of pixels, column data lines each of which electrically connects the pixels in a respective column of the pixels, and row selection lines each of which electrically connects the pixels in a respective row of the pixels,
the pixels in each of the rows being arrayed in a first direction, and the pixels in each of the columns being arrayed in a second direction,
the routing wires comprise column routing wires electrically connected to the column data lines at ends of the column data lines, respectively, and by which all of the pixels of the pixel array are electrically connected to the pixel array control circuitry of the second die, and row routing wires electrically connected to the row selection lines at ends of the row selection lines, respectively and by which all of the pixels of the pixel array are electrically connected to the pixel array control circuitry of the second die, and
all of the row routing wires and/or all of the column routing wires are linear, and extend lengthwise within the same layer in the first die parallel to one another in a diagonal direction that subtends acute angles with the first and second directions, respectively.

2. The image sensor of claim 1, wherein the column data lines each extend linearly in the first direction in the same metal layer in the sensor as the column routing wires,
the first die includes interlayer electrical connections extending vertically in a region of the first die adjacent the pixel array, and electrically connected to the column routing lines, and
all of the column routing wires extend linearly in the diagonal direction from the ends of the column data lines to the interlayer electrical connections such that the column data lines and the column routing lines are unitary.

3. The image sensor of claim 1, wherein the row selection lines each extend linearly in the second direction in the same metal layer in the sensor as the row routing wires,
the first die includes interlayer electrical connections extending vertically in a region of the first die adjacent the pixel array, and electrically connected to the row routing lines, and
all of the row routing wires extend linearly in the diagonal direction from the ends of the row selection lines to the interlayer electrical connections such that the column data lines and the row routing lines are unitary.

4. The image sensor of claim 1, wherein the column data lines each extend linearly in the first direction in a different metal layer in the sensor from the column routing wires,
the first die includes vertical contacts extending vertically in the first die from the ends of the column data lines, respectively, and interlayer electrical connections extending vertically in a region of the first die adjacent the pixel array, and
all of the column routing wires extend linearly in the diagonal direction from the vertical contacts to the interlayer electrical connections and are electrically connected to the vertical contacts and the interlayer electrical connections.

5. The image sensor of claim 1, wherein the row selection lines each extend linearly in the second direction in a different metal layer in the sensor from the row routing wires,
vertical contacts extending vertically in the first die from the ends of the column data lines, respectively, and interlayer electrical connections extending vertically in a region of the first die adjacent the pixel array, and
all of the row routing wires extend linearly in the diagonal direction from the vertical contacts to the interlayer electrical connections and are electrically connected to the vertical contacts and the interlayer electrical connections.

6. The image sensor of claim 1, wherein the pixel array control circuitry includes an analog to digital converter to which the columns of pixels are respectively electrically connected by the column routing wires, and drivers configured to apply voltages to the rows of the pixels and to which the rows of pixels are respectively electrically connected by the row routing wires.

* * * * *